US010637196B2

(12) United States Patent
Baum et al.

(10) Patent No.: US 10,637,196 B2
(45) Date of Patent: Apr. 28, 2020

(54) MODULAR JACK CONTACT ASSEMBLY HAVING CONTROLLED CAPACITIVE COUPLING POSITIONED WITHIN A JACK HOUSING

(71) Applicant: Bel Fuse (Macao Commercial Offshore) Limited, Andar H-J (MO)

(72) Inventors: Andrew David Baum, York, PA (US); Yakov Belopolsky, Harrisburg, PA (US); David Henry Gutter, Felton, PA (US); Derek Imschweiler, Glen Rock, PA (US); Richard D. Marowsky, York, PA (US); Mark Ellis, Glen Rock, PA (US)

(73) Assignee: Bel Fuse (Macao Commercial Offshore) Limited (MO)

( * ) Notice: Subject to any disclaimer, the term of this patent is extended or adjusted under 35 U.S.C. 154(b) by 0 days.

(21) Appl. No.: 16/259,455

(22) Filed: Jan. 28, 2019

(65) Prior Publication Data

US 2019/0157808 A1    May 23, 2019

Related U.S. Application Data

(63) Continuation-in-part of application No. 15/963,765, filed on Apr. 26, 2018, now Pat. No. 10,424,874,
(Continued)

(51) Int. Cl.
*H01R 13/6469* (2011.01)
*H01R 13/6466* (2011.01)
(Continued)

(52) U.S. Cl.
CPC ..... *H01R 13/6469* (2013.01); *H01R 13/6466* (2013.01); *H01R 13/6477* (2013.01);
(Continued)

(58) Field of Classification Search
CPC ............ H01R 13/6469; H01R 13/6466; H01R 13/6477
(Continued)

(56) References Cited

U.S. PATENT DOCUMENTS 4,508,410 A   4/1985 Canham
6,231,397 B1  5/2001 de la Borbolla et al.
(Continued)

FOREIGN PATENT DOCUMENTS

CN   201440501 U   4/2010
EP   0971459 A2    1/2000
(Continued)

OTHER PUBLICATIONS

Search Report for CN201680078668.5 dated Apr. 3, 2019 with English translation.
(Continued)

*Primary Examiner* — Peter G Leigh
(74) *Attorney, Agent, or Firm* — Patterson Intellectual Property Law, P.C.; Gary L. Montle

(57) ABSTRACT

A modular jack connector compensates for plug characteristics via a controlled primary compensation in the immediate vicinity of the connector interface. A jack contact assembly is positioned within a jack housing and includes first and second sets of elongate contacts each having a plug contact portion and a signal output portion. Each elongate contact is configured such that their respective plug contact portions are coplanar and a signal path is defined between their plug contact portions and their signal output portions. A flexible circuit board is coupled proximate to the plug contact portions, and configured to provide capacitance compensation between respective contacts engaged thereby, wherein the capacitance compensation is offset from a signal
(Continued)

path defined between the plug contact portions and the corresponding signal output portions.

29 Claims, 30 Drawing Sheets

Related U.S. Application Data which is a continuation of application No. PCT/US2016/060963, filed on Nov. 8, 2016.

(60) Provisional application No. 62/297,640, filed on Feb. 19, 2016, provisional application No. 62/254,023, filed on Nov. 11, 2015.

(51) Int. Cl.
*H01R 24/64* (2011.01)
*H05K 1/18* (2006.01)
*H05K 1/02* (2006.01)
*H01R 13/6477* (2011.01)
*H01R 13/6594* (2011.01)
*H01R 107/00* (2006.01)
*H01R 13/6461* (2011.01)

(52) U.S. Cl.
CPC .......... *H01R 24/64* (2013.01); *H05K 1/0228* (2013.01); *H05K 1/189* (2013.01); *H01R 13/6461* (2013.01); *H01R 13/6594* (2013.01); *H01R 2107/00* (2013.01); *H01R 2201/04* (2013.01); *H05K 2201/10189* (2013.01)

(58) Field of Classification Search
USPC .......................................................... 439/78
See application file for complete search history.

(56) References Cited

U.S. PATENT DOCUMENTS

| | | | | |
|---|---|---|---|---|
| 6,443,777 | B1 * | 9/2002 | McCurdy | H01R 13/6461 439/676 |
| 6,769,937 | B1 * | 8/2004 | Roberts | H01R 24/64 439/676 |
| 6,877,222 | B2 | 4/2005 | Patel | |
| 7,037,140 | B2 * | 5/2006 | Aekins | H01R 13/6461 439/676 |
| 7,038,554 | B2 | 5/2006 | Seefried | |
| 7,048,590 | B2 | 5/2006 | Colantuono et al. | |
| 7,153,163 | B2 | 12/2006 | Lewis et al. | |
| 7,153,168 | B2 | 12/2006 | Caveney et al. | |
| 7,166,000 | B2 | 1/2007 | Pharney | |
| 7,190,594 | B2 | 3/2007 | Hashim et al. | |
| 7,429,195 | B2 | 9/2008 | Buckmeier et al. | |
| 7,485,010 | B2 * | 2/2009 | Aekins | H01R 13/41 439/620.13 |
| 7,601,034 | B1 * | 10/2009 | Aekins | H01R 13/6464 439/676 |
| 7,682,203 | B1 * | 3/2010 | Pharney | H01R 13/6658 439/676 |
| 7,686,650 | B2 | 3/2010 | Belopolsky et al. | |
| 7,708,603 | B1 * | 5/2010 | Little | H01R 13/6464 439/676 |
| 7,857,667 | B1 * | 12/2010 | Wang | H01R 13/6466 439/676 |
| 7,914,346 | B2 * | 3/2011 | Pharney | H01R 13/6658 439/676 |
| 7,924,130 | B2 | 4/2011 | Buckmeier et al. | |
| 7,967,644 | B2 | 6/2011 | Pepe et al. | |
| 7,967,645 | B2 * | 6/2011 | Marti | H01R 13/6658 439/676 |
| 7,976,348 | B2 * | 7/2011 | Aekins | H01R 13/6625 439/676 |
| 8,033,863 | B2 | 10/2011 | Gutter et al. | |
| 8,077,004 | B2 | 12/2011 | Buckmeier et al. | |
| 8,128,432 | B2 * | 3/2012 | Jaouen | H01R 13/6464 439/620.01 |
| 8,137,141 | B2 * | 3/2012 | Straka | H05K 1/0228 439/676 |
| 8,167,661 | B2 * | 5/2012 | Straka | H01R 13/516 439/676 |
| 8,395,329 | B2 | 3/2013 | Jutras et al. | |
| 8,405,481 | B2 | 3/2013 | Renteria | |
| 8,951,072 | B2 * | 2/2015 | Hashim | H01R 13/6461 439/676 |
| 9,124,101 | B2 | 9/2015 | Jutras et al. | |
| 9,407,044 | B2 | 8/2016 | Caveney et al. | |
| 2001/0016455 | A1 | 8/2001 | Reichle | |
| 2003/0134529 | A1 | 7/2003 | Murr et al. | |
| 2003/0194908 | A1 | 10/2003 | Brown et al. | |
| 2004/0023563 | A1 | 2/2004 | Ciezak et al. | |
| 2004/0127105 | A1 | 7/2004 | Itano et al. | |
| 2007/0040645 | A1 | 2/2007 | Sedio et al. | |
| 2007/0217173 | A1 | 9/2007 | Mizutani et al. | |
| 2009/0142968 | A1 | 6/2009 | Goodrich et al. | |
| 2009/0191740 | A1 * | 7/2009 | Aekins | H01R 13/7033 439/218 |
| 2009/0265918 | A1 | 10/2009 | Dounaevsky | |
| 2010/0048040 | A1 | 2/2010 | Straka et al. | |
| 2012/0076459 | A1 | 3/2012 | Sell | |
| 2012/0100744 | A1 | 4/2012 | Bolouri-Saransar et al. | |
| 2012/0156932 | A1 * | 6/2012 | Straka | H01R 13/6658 439/620.24 |
| 2013/0210288 | A1 | 8/2013 | Schumacher et al. | |
| 2013/0210289 | A1 | 8/2013 | Schumacher et al. | |
| 2014/0011403 | A1 | 1/2014 | Siev et al. | |
| 2014/0073196 | A1 | 3/2014 | Hashim et al. | |
| 2014/0203886 | A1 | 7/2014 | Schumacher | |
| 2014/0227911 | A1 | 8/2014 | Lim et al. | |
| 2014/0273629 | A1 | 9/2014 | Canning et al. | |
| 2014/0273657 | A1 | 9/2014 | Hashim et al. | |
| 2016/0020567 | A1 | 1/2016 | Belopolsky et al. | |
| 2016/0093431 | A1 | 3/2016 | Quilici | |
| 2016/0172079 | A1 | 6/2016 | Rohrer | |
| 2016/0187951 | A1 | 6/2016 | Buckmeier et al. | |

FOREIGN PATENT DOCUMENTS

| | | |
|---|---|---|
| EP | 1246318 A2 | 10/2002 |
| EP | 2765656 A1 | 8/2014 |
| GB | 2343558 A | 5/2000 |
| WO | 2005101588 A1 | 10/2005 |
| WO | 2006081423 A1 | 8/2006 |
| WO | 2010065588 A1 | 6/2010 |

OTHER PUBLICATIONS

International Search Report and Written Opinion for International Application PCT/US2018/025858, dated Jun. 22, 2018, 13 pages.
International Search Report and Written Opinion for International Application PCT/US2016/043334, dated Aug. 4, 2017, 9 pages.
International Search Report for International Application PCT/US2016/060963, dated Feb. 17, 2017, 13 pages.

* cited by examiner

MODULAR JACK CONTACT ASSEMBLY HAVING CONTROLLED CAPACITIVE COUPLING POSITIONED WITHIN A JACK HOUSING

CROSS-REFERENCES TO RELATED APPLICATIONS

This application is a continuation-in-part of U.S. patent application Ser. No. 15/963,765, filed Apr. 26, 2018, which is a continuation of International Patent Application No. PCT/US2016/060963, filed Nov. 8, 2016, and further claims benefit of U.S. Provisional Patent Application Nos. 62/254,023, filed Nov. 11, 2015, and 62/297,640, filed Feb. 19, 2016, which are hereby incorporated by reference.

A portion of the disclosure of this patent document contains material that is subject to copyright protection. The copyright owner has no objection to the reproduction of the patent document or the patent disclosure, as it appears in the U.S. Patent and Trademark Office patent file or records, but otherwise reserves all copyright rights whatsoever.

BACKGROUND

The present invention relates generally to modular connectors. More particularly, the present invention relates to a modular jack design for very high speed applications in support 10, 25, 40 Gigabit Ethernet protocols, sometimes referred as MULTIGBASE-T protocols.

The use of modular jacks and plugs for data transmission is common. Jacks receive the plugs that are attached to the ends of an electrical cable. Jacks are mounted to, and are an integral part of electronic devices such as switches or routers in the data centers or computers in offices. The cable is terminated by plugs, and the electronic equipment has to have jacks corresponding to the plugs. Plugs and jacks are designed to be able to mate to provide both mechanical and electrical coupling. In premise wiring systems, the jack may also be connected to cables as a free hanging connector.

The electrical cables have multiple conductors or wires. For Ethernet connections, typically eight wires are used. The electromagnetic signals within each mated pair travel from the equipment side to the cable side and vice versa, using designated contact pairs such as 1-2, 3-6, 4-5, 7-8. Mechanical dimensions of the plug and the jack and their interface are governed by international standards. In the case of the connectors employed in the Ethernet signal transmission, the governing standards are International Electrotechnical Commission ("IEC") standards 60603-7 series.

From the transmission point of view, the jacks, cable and plug represent components of a channel. The channels and corresponding components performance are referred as classes and categories specified in the IEC/ISO 11801 standards shown in the following table:

| ISO/TEC 11801 | ANSI/TIA-568-C.1 CATEGORY | FREQ. MAX. CHARACTERIZATION |
| --- | --- | --- |
| Class C | 3 | 16 MHz |
| Class D | 5e | 100 MHz |
| Class E | 6 | 250 MHz |
| Class $E_A$ | 6A | 500 MHz |
| Class F | 7 | 600 MHz |
| Class $F_A$ | $7_A$ | 1000 MHz |
| Class I | 8.1 | 2000 MHz |
| Class II | 8.2 | 2000 MHz |

A common mechanical connector configuration known as RJ45 (described in the IEC60603-7 series of standards) allows for connections between 40 GbE (Gigabits per second of Ethernet frame transmission) and lower speed equipment through a feature called auto-negotiation. During the auto-negotiation process, both devices assume the master-slave relations and agree on the maximum speed for data to be transmitted.

The channels should be able to support the Ethernet protocols and may affect the auto-negotiation. Electrical cables may be connected to plugs and plugged into jacks disposed within the various generations of Ethernet equipment. However, channels designed to older Ethernet speeds will slow down and force the newer and faster networking equipment to run below its intended speed. There are no known modular connectors that work in the wide spectra from 10 to 2000 MHz without causing some degradation of the signals.

As previously noted, the Ethernet protocols divide the signal into four streams which are transmitted over the same cable. Thus, with a mated connector pair there are also four streams of signals operating simultaneously. The unwanted interaction of these signals called Near End Cross Talk (or "NEXT") has to be minimized to allow error-free transmission. The most common means of reducing the NEXT is compensation. Compensation is a method of creating NEXT of similar amplitude but opposite polarity from the NEXT created at the interface between the jack and the plug.

Signal degradation at high frequency is caused by several mutually dependent issues. One issue is where the primary compensation is too far away from the interface, causing an unpredictable phase shift of electromagnetic signals traveling within the jack-plug mated connectors. Another issue is that the plug contact blades have high intrinsic self-inductance, and uncontrolled and relatively low capacitance between adjacent contacts. The jack should compensate for the plug inductance and capacitance. Conventional designs include a board that adds compensation at the tips of the contacts, but the electrical length between the contact point and the compensation is too great to completely cancel the plug inductance and capacitance in both phase and magnitude.

BRIEF SUMMARY

Embodiments of a modular jack connector as disclosed herein may comprise part of a Class I channel with category 8.1 connectors, supporting the 40 GbE protocol. Such connectors may desirably further assure safe electrical isolation, being configured to withstand 1000 VDC between adjacent contacts and 1500 VDC between all the contacts and shields.

Connectors as disclosed herein may mate with either of slow speed equipment, i.e., 100 MHz and the highest speed equipment, i.e., 2000 MHz, without degrading performance. Such connectors may desirably further be of low cost and easy to manufacture, minimizing the number of jack piece parts and internal components. Still another exemplary aspect includes transmission pairs which are controlled within the jack, assuring isolation by air gap or other insulation.

In one particular embodiment of a network interface connector as disclosed herein, a jack contact assembly having controlled capacitive coupling is positioned within a jack housing. First and second sets of elongate contacts each are provided with a plug contact portion and a signal output portion, wherein each of the elongate contacts are configured such that their respective plug contact portions are coplanar and a signal path is defined between their plug contact portions and their signal output portions. A flexible circuit board (FCB) is coupled proximate to the plug contact portion, wherein the FCB is configured to provide capacitance compensation between respective contacts engaged thereby. The capacitance compensation is offset from a signal path defined between the plug contact portions and the corresponding signal output portions, but the phase shift between the primary compensation and contact interface is reduced due to the proximity of the FCB coupling.

One desirable aspect of such an embodiment may include that the offset introduces a controlled amount of inductance to the phase of the compensation circuit, approximately equal to the inductance of the corresponding plug contact blades. That compensating inductance allows the plug connector as disclosed herein to provide Near End Cross Talk compensation across very wide spectra from 10 to 2000 MHz. Exemplary offset dimensions in such an embodiment may range from 0.001" to 0.030".

The plug contact portions for each of the elongate contacts in such an embodiment may further be provided with a first side configured to engage a corresponding contact for a plug connector, and a second side coupled to the FCB.

The FCB in such an embodiment may further include a flexible substrate with first and second copper layers applied on opposing sides thereof.

The controlled capacitance in such an embodiment of the FCB may further be configured to cancel resident capacitance between adjacent plug contacts coupled to the jack contact assembly, wherein a value of the controlled capacitance is based on a controlled dielectric constant and thickness of the flexible substrate further in view of an overlapping area of first and second copper plates respectively associated with the first and second copper layers. The first copper plate in such an embodiment may further be smaller than and enveloped with respect to the second copper plate.

The FCB in such an embodiment may further be coupled to the elongate contacts at a middle portion between first and second opposing ends, and the overlapping area of the first and second copper layers associated with one or more of the first and second opposing ends. The FCB may be flexed from the middle portion into an arcuate configuration.

The network interface connector may further comprise at least one contact alignment member receiving each of the elongate contacts there through. In such an embodiment, the at least one contact alignment member may further be molded over the elongate contacts and formed of an insulating material. Alternatively, each of the elongate contacts may be coupled to the at least one contact alignment member between their respective plug contact and signal output portions.

In such an embodiment, an electrically isolated compression spring may further be mounted between an internal wall of the jack housing and the at least one contact alignment member, and configured to apply a normal force to the contact assembly.

The signal output portions of the first set of elongate contacts in an exemplary such embodiment may further be maintained in a first coplanar array, wherein the signal output portions of the second set of elongate contacts are maintained in a second coplanar array parallel to the first coplanar array.

Each of the elongate contacts in an exemplary such embodiment may further comprise a lead-in contact portion extending from the plug contact portion and distal to the signal output portion, wherein the lead-in contact portion is configured to engage a corresponding plug contact during an insertion process and prior to full insertion and engagement of the plug contact.

The network interface connector in an exemplary such embodiment may further comprise an insulating contact guide frame surrounding the contact assembly, having embedded protective slots configured to receive the elongate contacts, and ribs extending from the contact guide frame to engage and guide plug contacts during an insertion process.

A jack contact set with primary compensation (i.e., "engine") according to such an embodiment may be capable of being mounted both to a printed circuit board (PCB) portion of active equipment and cable termination portions of free hanging jacks.

An alternative network interface connector according to an embodiment as disclosed herein may further comprise a rigid PCB to which each of the signal output portions are coupled, and configured to provide a secondary compensation. A jack shield may encapsulate the jack housing and further provide an electrical ground path between the rigid PCB and a plug connector when engaging the jack contact assembly.

DETAILED DESCRIPTION

Figure 1:
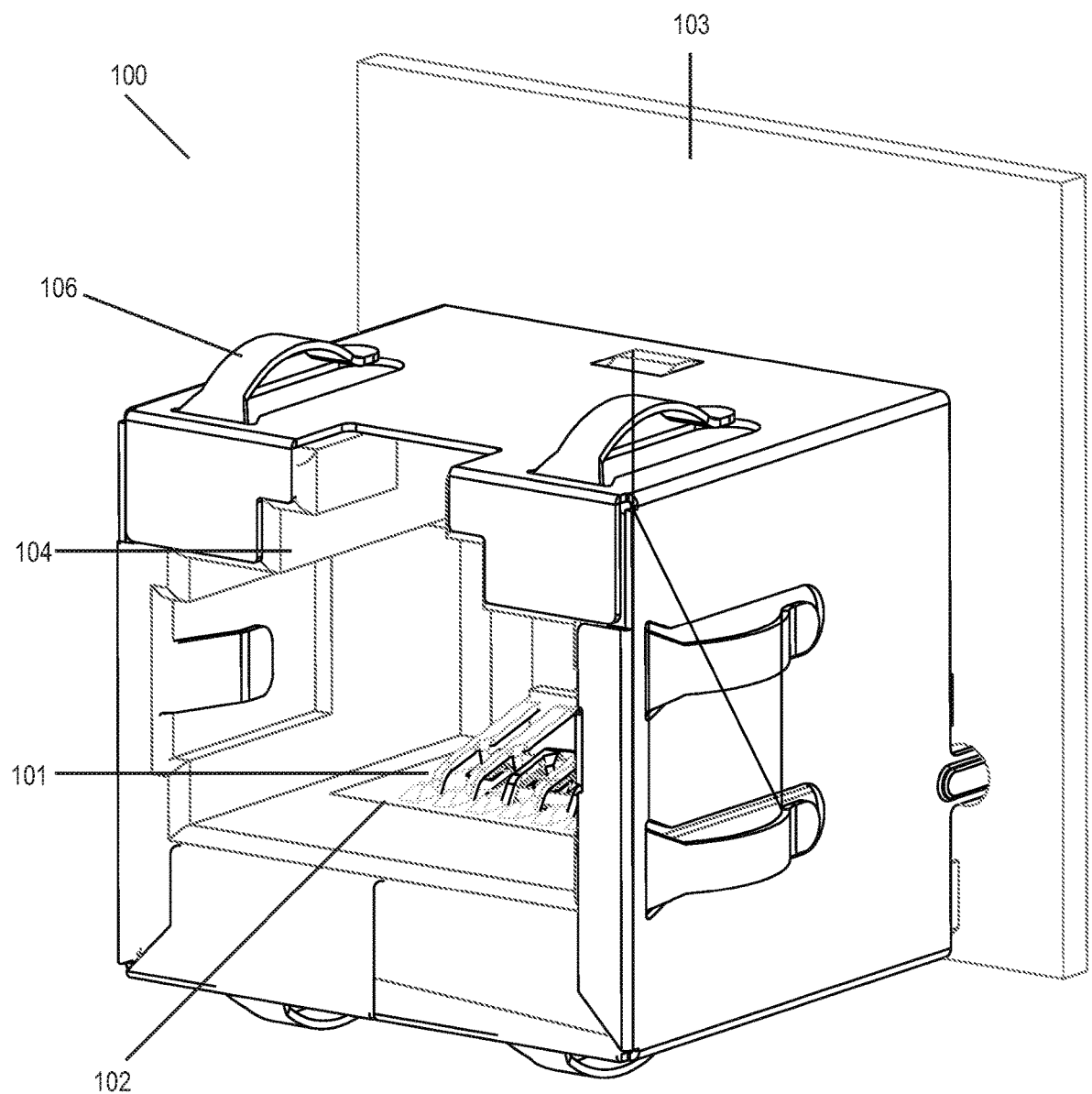
FIG. 1 is an isometric view of a fully assembled network interface connector as disclosed herein.

Referring generally to FIGS. 1-34, various exemplary embodiments of an invention may now be described in detail. Where the various figures may describe embodiments sharing various common elements and features with other embodiments, similar elements and features are given the same reference numerals and redundant description thereof may be omitted thereafter. The figures themselves are intended solely for the purposes of illustration, and are not limiting on the scope of an invention as disclosed herein unless otherwise expressly stated.

Generally stated, embodiments of a modular jack design as disclosed herein correspond in mechanical details, size and shape to the industry standard RJ45 plug. The phase shift and corresponding signal degradation are minimized, as the primary compensation is in the immediate vicinity of the connector interface.

There are three areas where the primary compensation is utilized: the compensation within a flexible circuit board attached to jack contact branches; the mutual position of the contacts within a contact set (also identified herein as a contact cross-over area); and a rigid printed circuit board (PCB) to which the contacts are attached, also referred to herein as a secondary compensation board. Each of the crosstalk compensation circuits address a complete spectrum of the potential jack applications from about 10 to about 2000 MHz.

Figure 2:
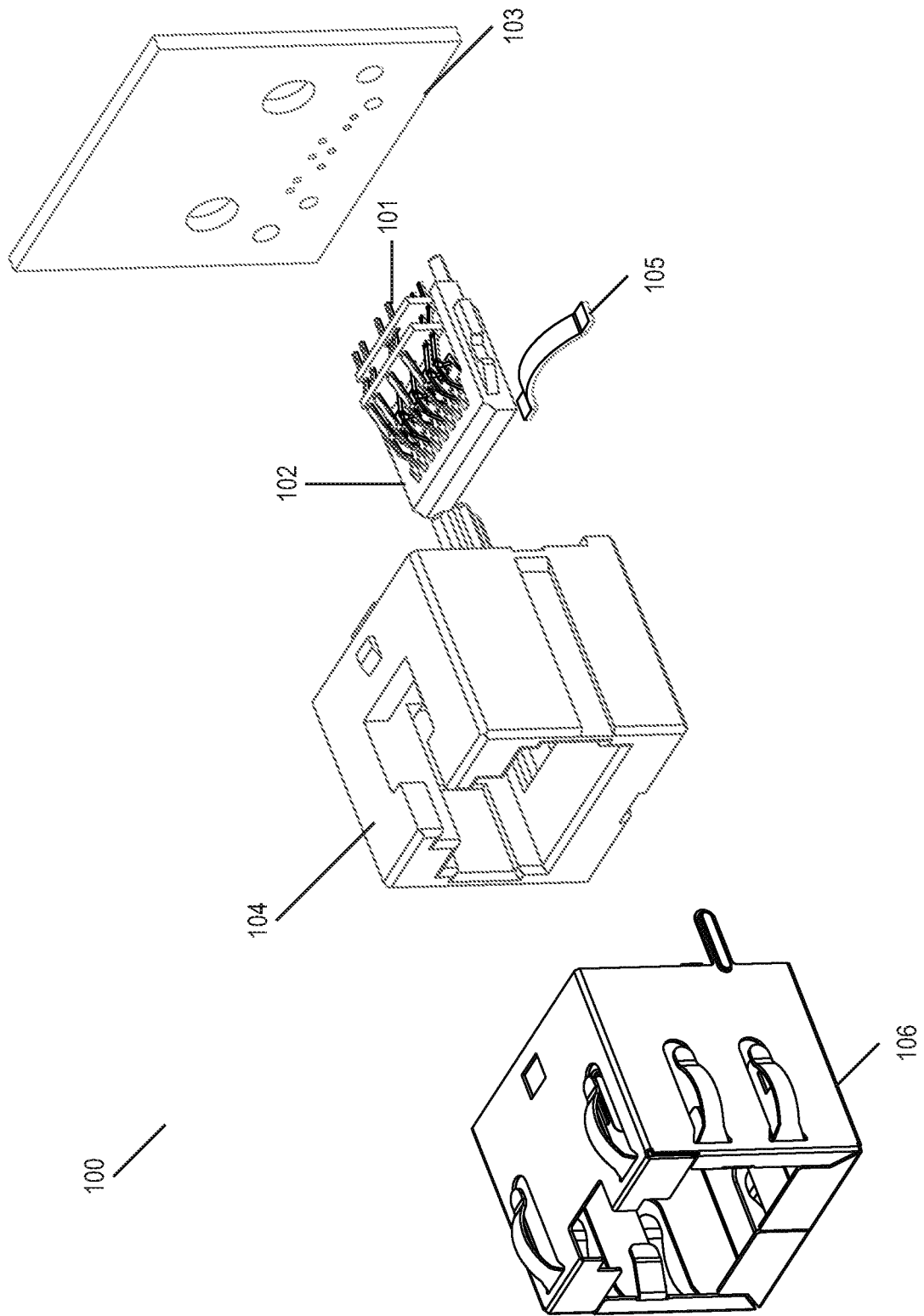
FIG. 2 is an exploded view of the network interface connector of FIG. 1.
Figure 3:
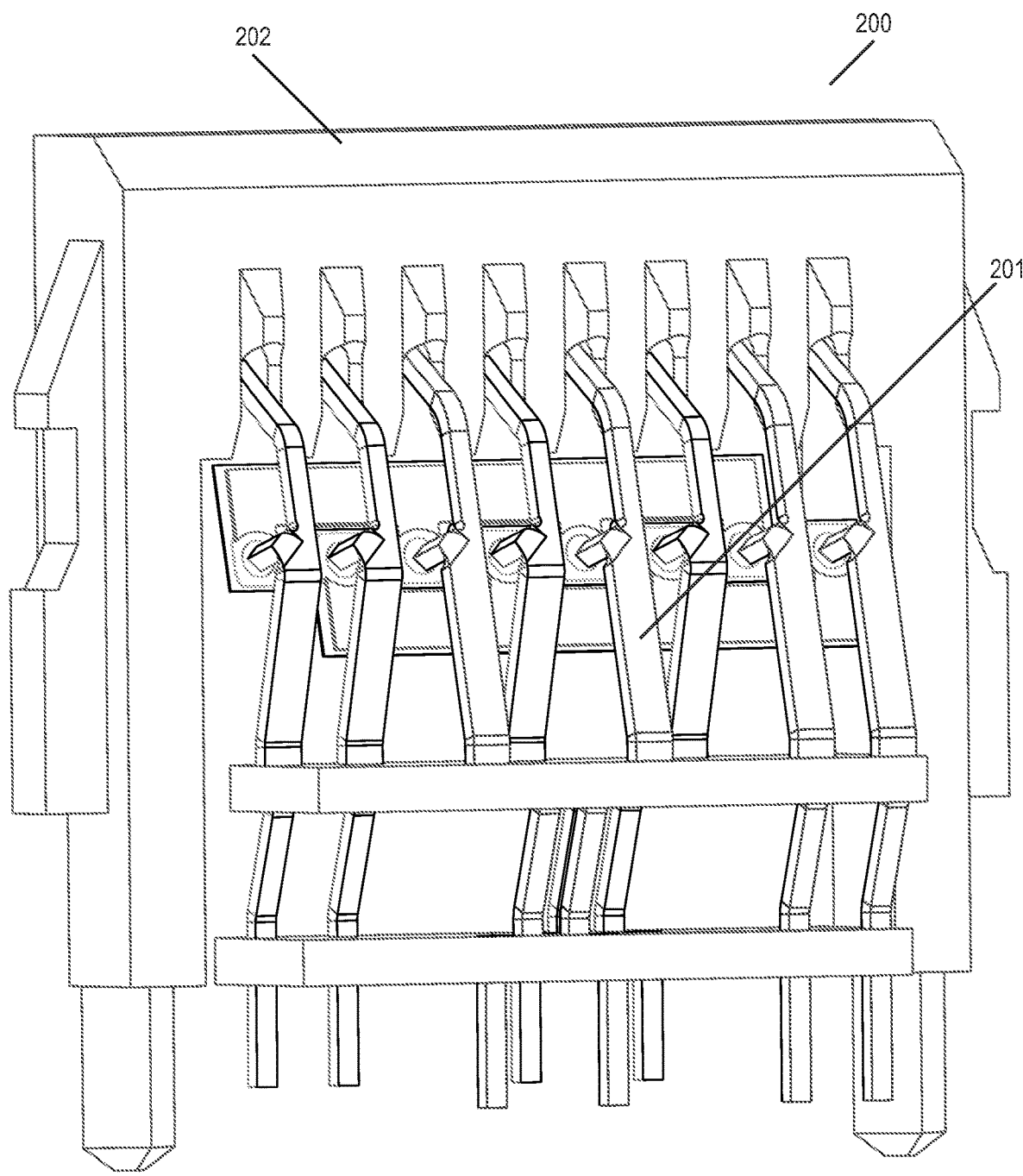
FIG. 3 is an isometric view of a jack contact set and guide frame according to a first embodiment of the connector as disclosed herein.
Figure 4:
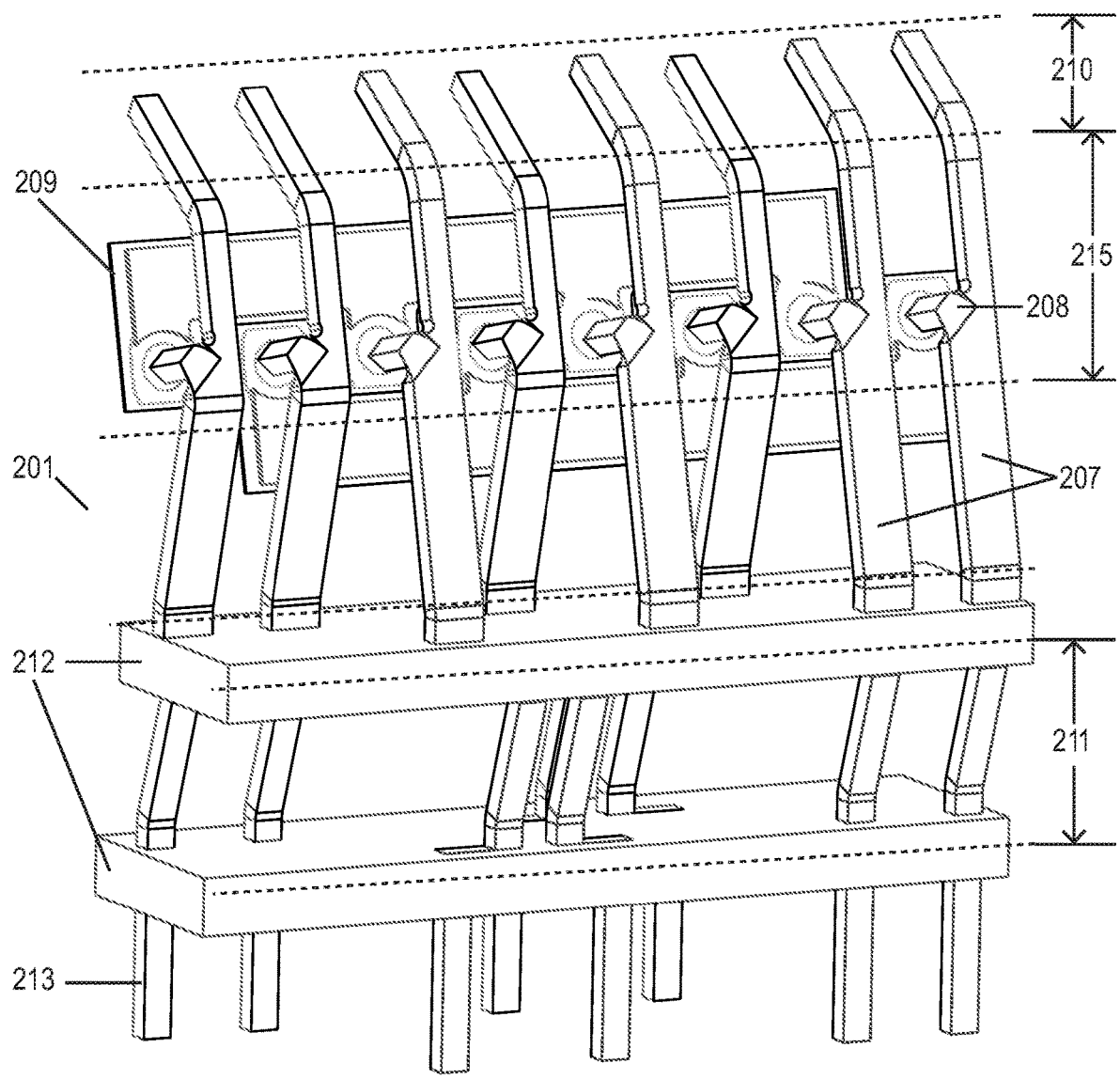
FIG. 4 is an isometric view of the jack contact set of FIG. 3.
Figure 5:
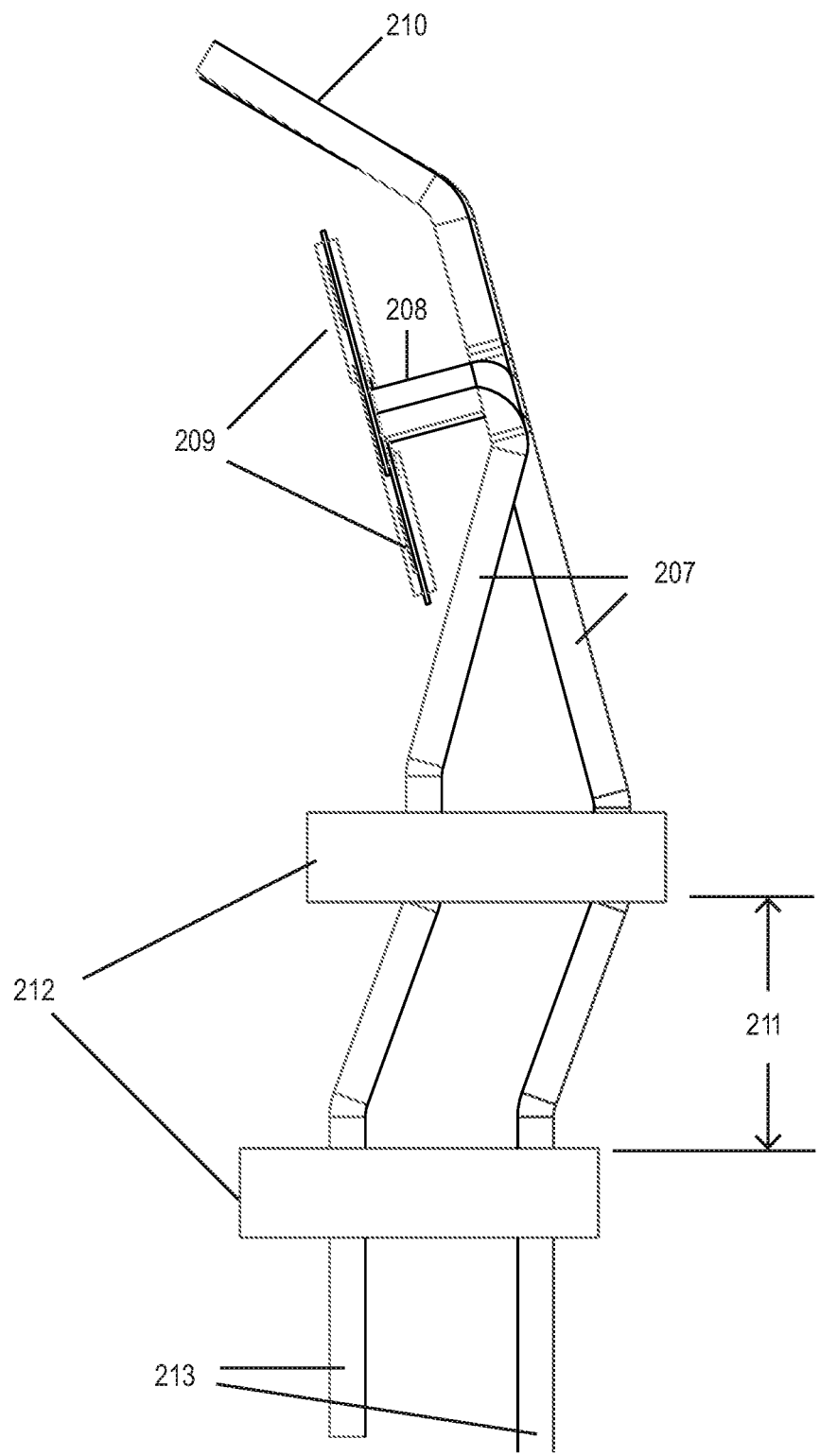
FIG. 5 is a side view of the jack contact set of FIG. 3.
Figure 6:
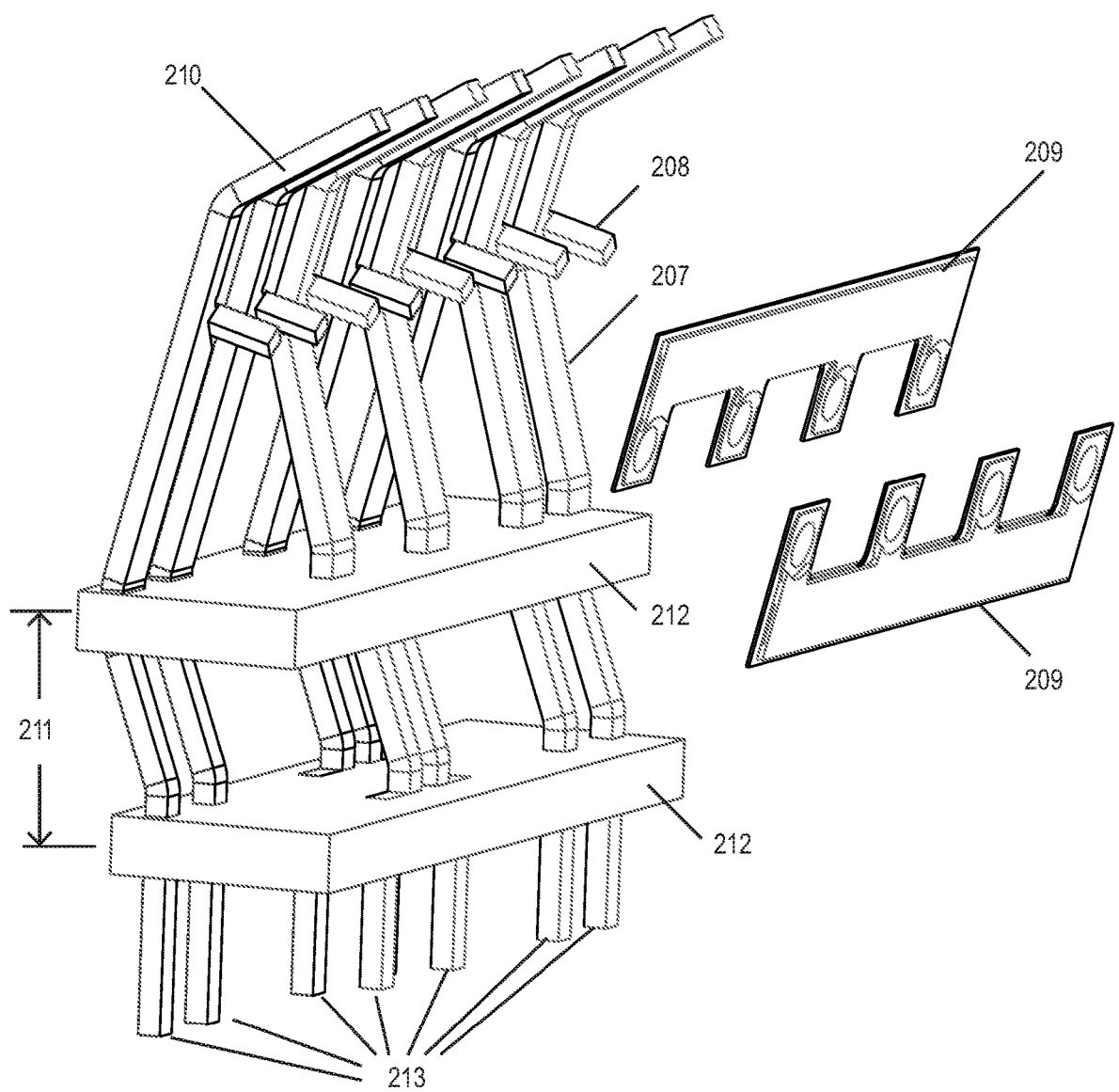
FIG. 6 is an inverted isometric view of the jack contact set of FIG. 3, with an exploded view of the flexible circuit boards.

Referring broadly to FIGS. 1 and 2, various embodiments of a network interface connector 100 as disclosed herein may generally include a contact assembly 101 surrounded by an insulating guide frame 102. The contact set 101 and guide frame are further mounted within a jack housing 104. The jack housing 104 holds the contact set 101 in proper orientation for engagement with the plug. A latching feature may be provided within the housing 104, enabling the plug to be easily attached and unattached to the jack by hand without the use of tools. The housing may also have post features that locate the jack to a rigid PCB 103, to which the contact set 101 is mounted. This PCB 103 provides the circuit path to connect the contact set to either active equipment or transmission cables. Incorporated in this PCB 103 is secondary compensation that is needed for the system to meet the performance requirements.

In certain embodiments wherein more contact normal force is desired, a helper spring 105 may be provided. The helper spring 105 may be isolated (insulated) from the jack contacts 101, allowing it to add contact force without degrading the electrical performance. The helper spring 105 may be a leaf spring that is mounted within the housing 104 between the housing internal wall and one or more over-molded contact carriers (further described below). This spring 105 acts in compression, bears on the inside back wall and applies a pre-loaded force to the contact set 101. When the plug is inserted, the contact set 101 is deflected and simultaneously deflects the helper spring 105. The total contact normal force for the jack system consists of the sum of the forces supplied by all of the contacts that comprise the contact set and the helper spring.

In various embodiments, a jack shield 106 further provides an electrical ground path between the plug and the secondary compensation PCB 103. This ground path surrounds the jack and protects the electrical signals contained within from outside interference (EMI, ESD, etc.). Spring-like panel ground features on the shield extend the ground path by interconnecting to a conductive mounting panel or conductive shielding box (Faraday cage).

With further reference now to FIGS. 3-10, a first exemplary embodiment of the jack connector 200 is described. Features and components of a contact set 201 that contribute to the improvement of the electrical performance of the system include short jack contacts 207, short interconnecting branches 208, first and second flexible circuit boards (FCBs) 209, lead-in contact extensions 210, a contact crossover area 211, and over-molded contact alignment members 212. The contact set 201 is contained within a jack housing 104 and provides the primary compensation for the interconnection of the plug to the secondary compensation and the output of the jack.

For improved electrical performance, the electrical length of the jack contacts 207 may preferably be kept to a minimum. These jack contacts 207 interconnect the plug interface with the primary and secondary compensation. Short contacts do not typically lend themselves to the best mechanical performance, and therefore the jack contacts 207 of the disclosed design should provide good contact force to maintain stable, reliable electrical contact at the plug-jack interface. Short contacts are also typically stiff and easily overstressed. The jack contacts 207 of the present disclosure may accordingly be designed as thin and flexible to prevent overstressing and permanent deformation (yielding).

On the jack contacts 207, there are short branches 208 to which the FCBs 209 are mounted by means of soldering, welding, or otherwise bonding. These branches 208 connect primary compensation to the jack contact interface point 215 with the shortest possible electrical length, while retaining an offset of the primary compensation with respect to the signal path from the interface point 215 to the rigid PCB 103. The branches 208 may straddle the plastic barrier walls that are part of the plug specification, and may also be integral parts of the jack contacts 207, thus eliminating the need for additional components to serve this purpose. As one example, the branches 208 may be stamped and formed from the same piece of native base material. Alternatively, they could be formed separately and mechanically and electrically connected via welding, soldering, bonding, etc.

Primary compensation is supplied to the jack connector in the first embodiment by a pair of FCBs 209. The flexible nature of the FCBs 209 allows for variation in the height of plug contacts while maintaining consistent and reliable contact force between the plug and jack contacts. These FCBs 209 contain circuits connecting every other contact position with controlled capacitance. For example, one FCB 209 may supply capacitance to odd contacts (e.g., 1, 3, 5 and 7 in a typical 8-contact set), and the other supplies the compensation to the even contacts (e.g., 2, 4, 6, 8). The controlled capacitance in the FCBs 209 cancels out the plug's resident capacitance between adjacent plug contacts.

Using two FCBs 209 in the present embodiment enables simplification of the design of each FCB 209, making them easier and less costly to produce, and further providing more direct connections to the compensation circuits and reducing the convolutions in the circuit paths needed to straddle the adjacent contacts and the electrical length of the compensation circuit. Shorter compensation circuit lengths better match phase and reduce the magnitude of the compensation needed to cancel the plug's resident capacitance. Although the individual FCBs 209 have shorter electrical lengths, the mechanical distance between connection points (every other contact) are twice as long as a one piece FCB 209 that connects to every contact. This longer distance gives greater flexibility and significantly reduces the mechanical stress occurring during plug mating. Since each FCB 209 is only attached to four contacts, the contacts can move more independently, as opposed to a single FCB 209 that connects all eight contacts.

In the present embodiment, one FCB applies capacitance between contact positions 6 to 8, 6 to 4, and 6 to 2 (notice that position 6 is common to all). The other FCB applies capacitance between contact positions 3 to 7, 3 to 5, and 3 to 1 (notice that position 3 is common to all). The symmetry of the connector system allows for the same capacitance values of the FCB that is used on the odd number contacts to be used for the even number contact positions (the capacitance values for 3-1=6-8, 3-5=6-4, and 3-7=6-2). This symmetry thus allows for the same identical FCB to be used for both odd contacts and even contacts by simply inverting its orientation.

Figure 8:
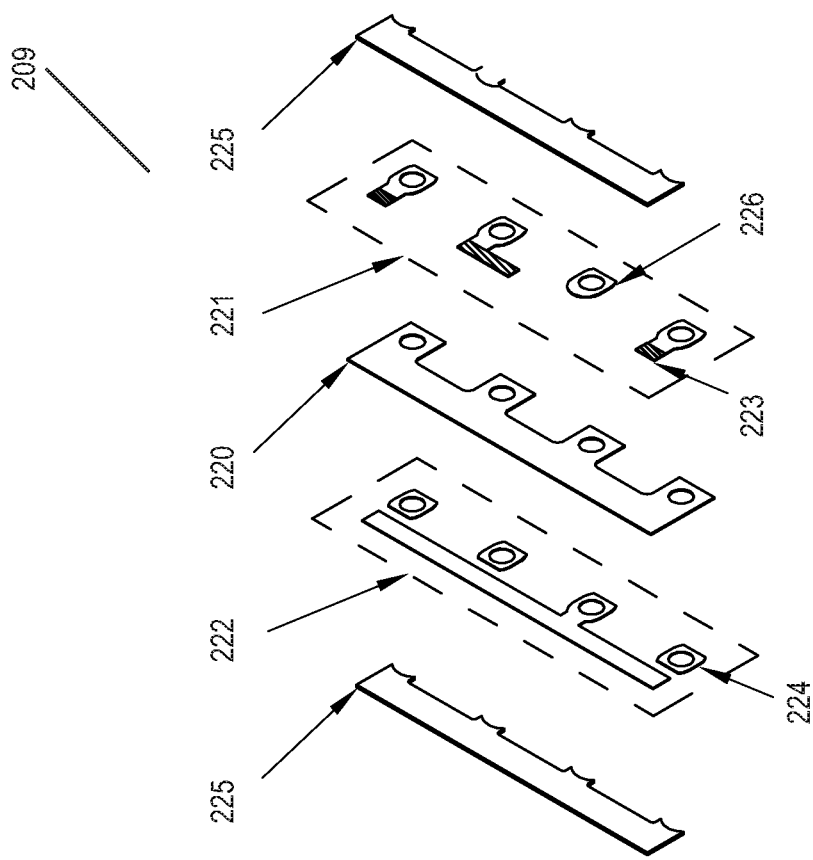
FIG. 8 is an exploded view of the flexible circuit board of FIG. 7.
Figure 7:
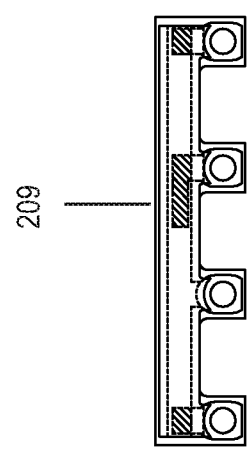
FIG. 7 is a front view of one of the flexible circuit boards of FIG. 3.
Figure 9:
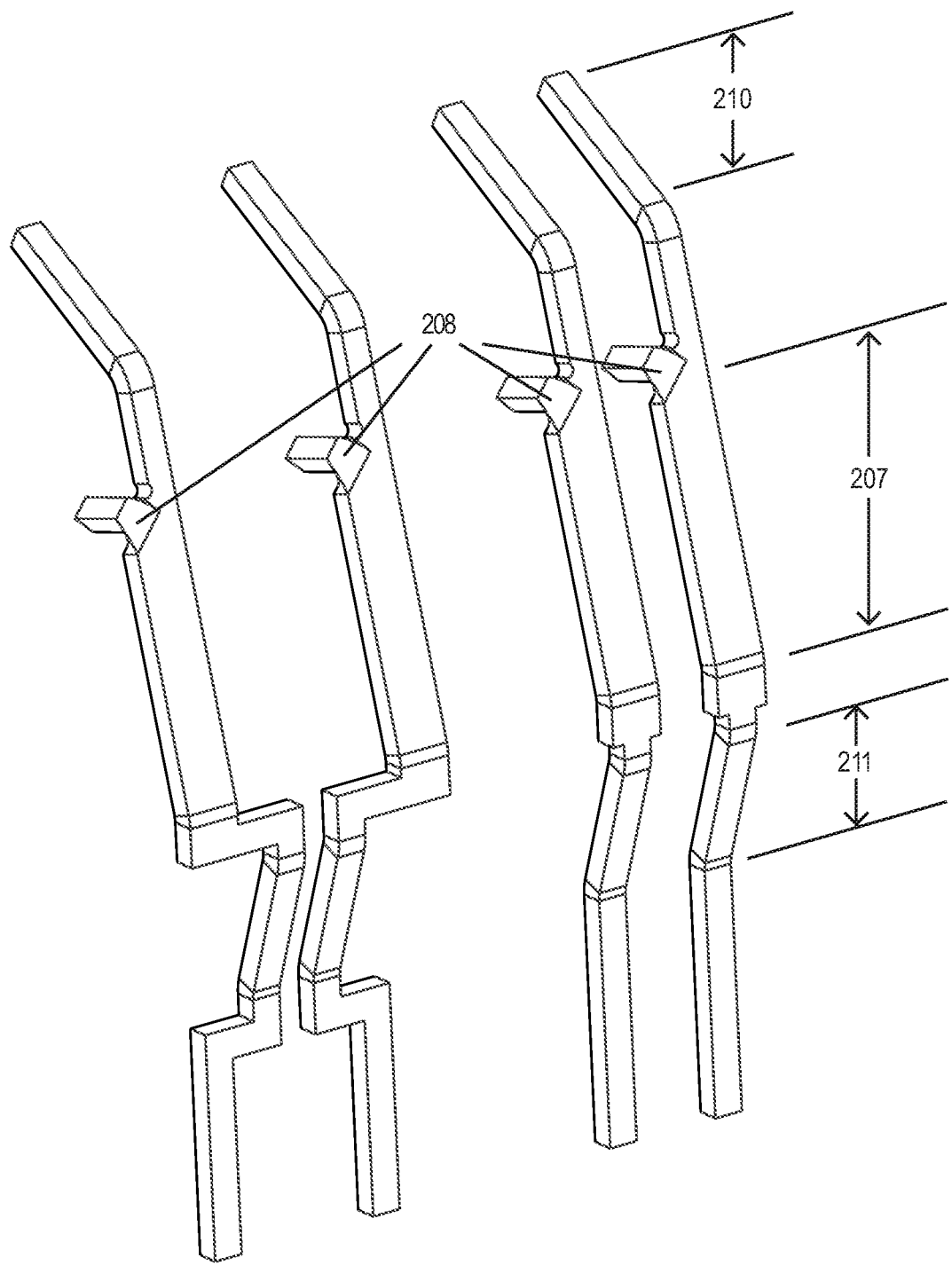
FIG. 9 is an isometric view of the first (top) contact array from the jack contact set of FIG. 3.
Figure 10:
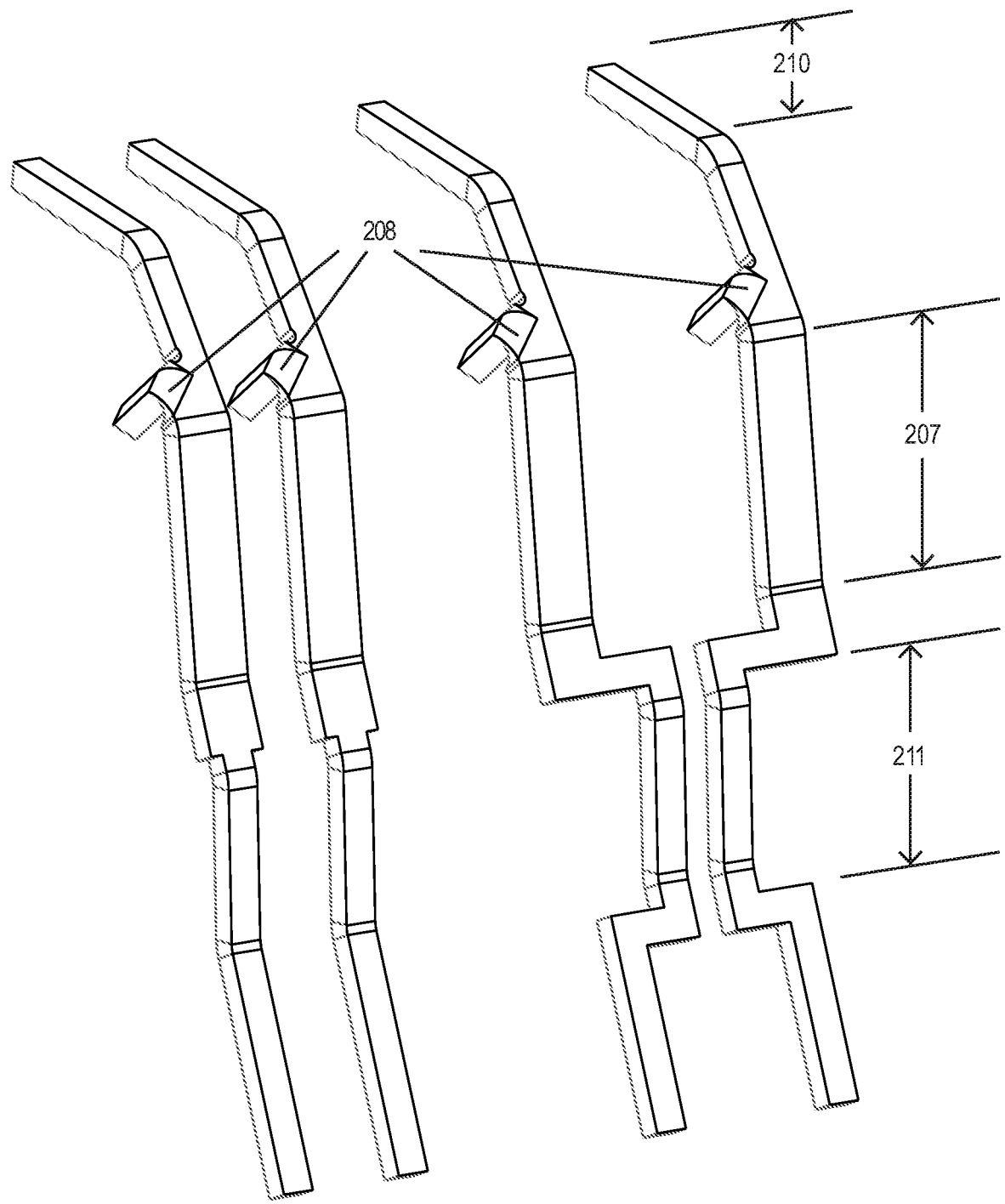
FIG. 10 is an isometric view of the second (bottom) contact array from the jack contact set of FIG. 3.
Figure 11:
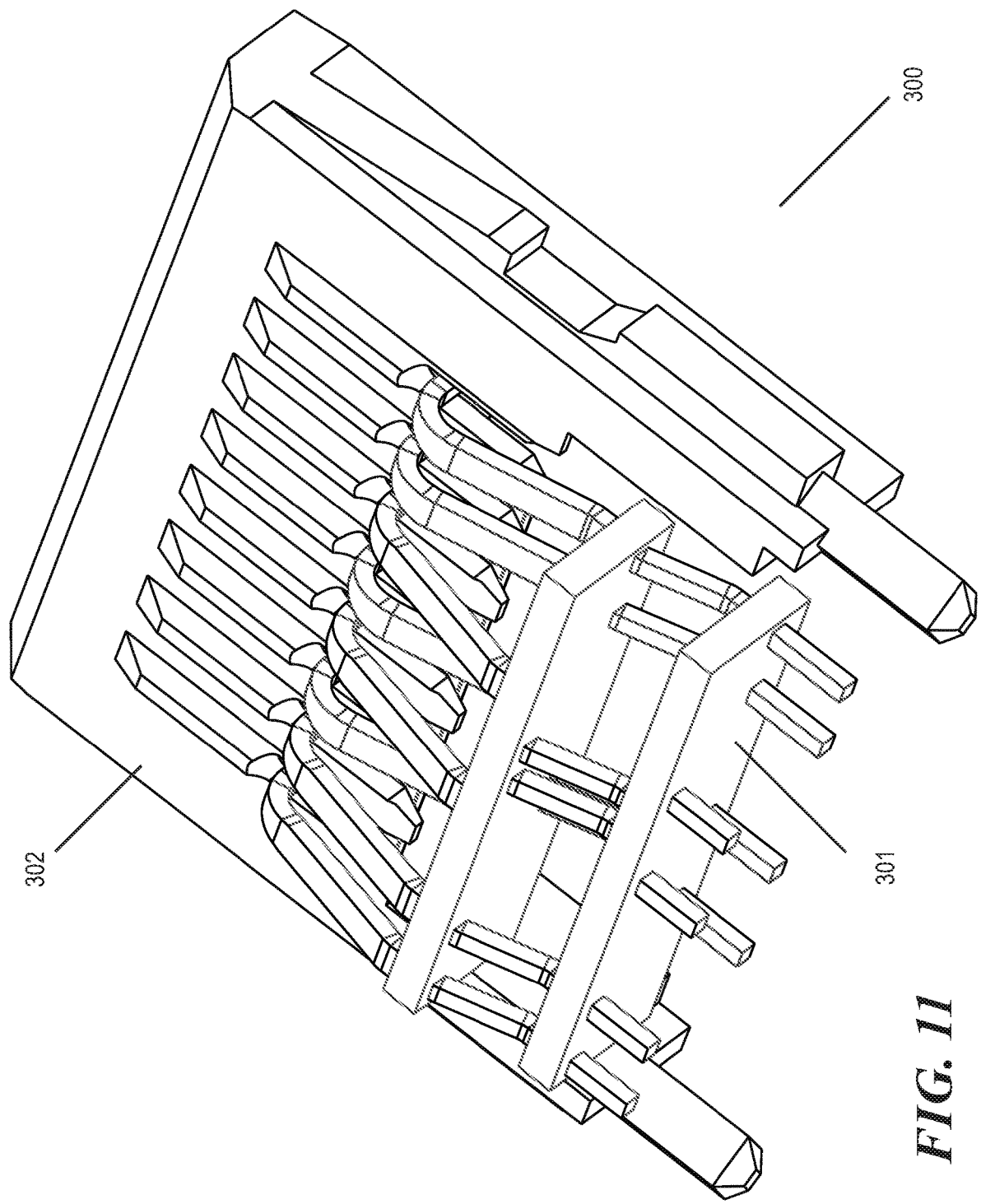
FIG. 11 is an isometric view of a jack contact set and guide frame according to a second embodiment of the connector as disclosed herein.
Figure 13:
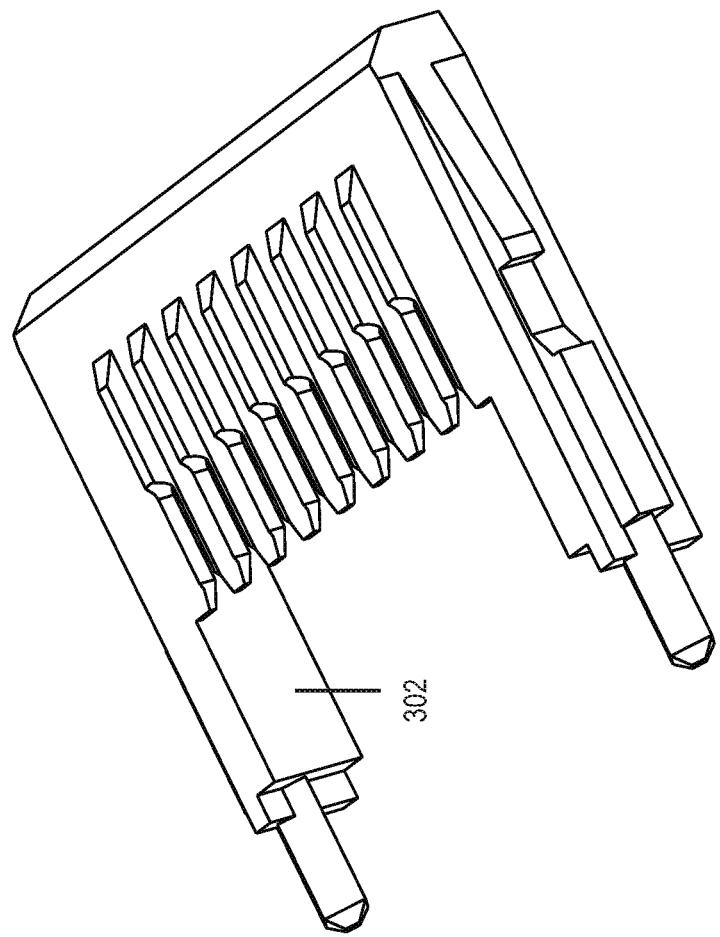
FIG. 13 is an isometric view of the guide frame of FIG. 11.
Figure 12:
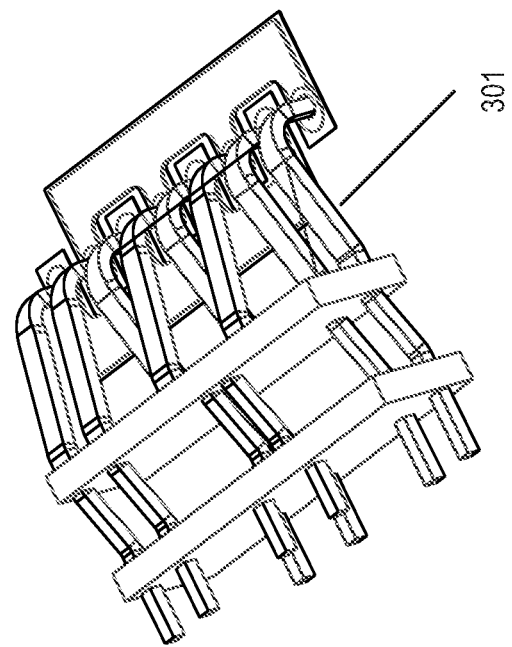
FIG. 12 is an isometric view of the jack contact set of FIG. 11.
Figure 15:
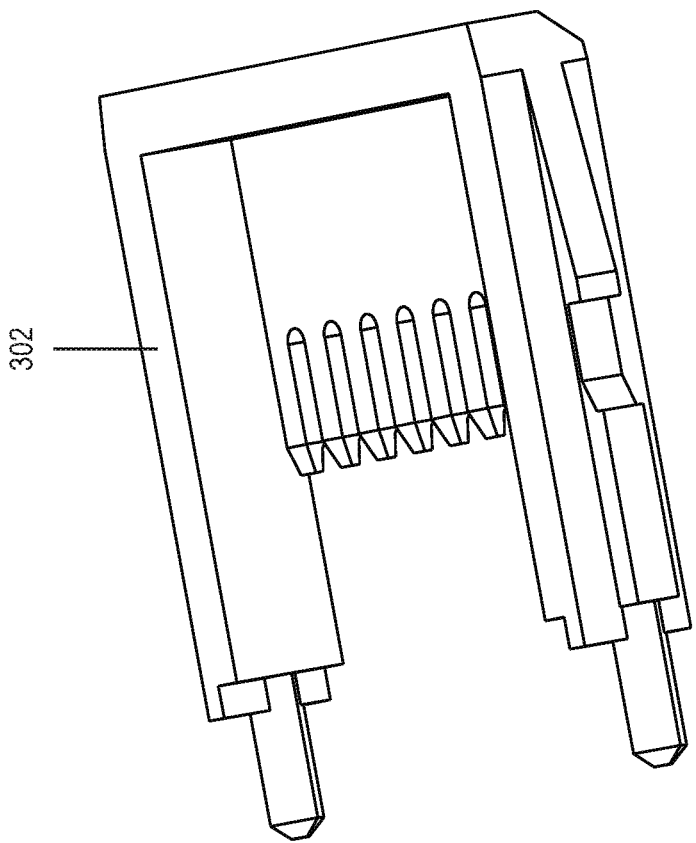
FIG. 15 is an inverted isometric view of the guide frame of FIG. 11.
Figure 14:
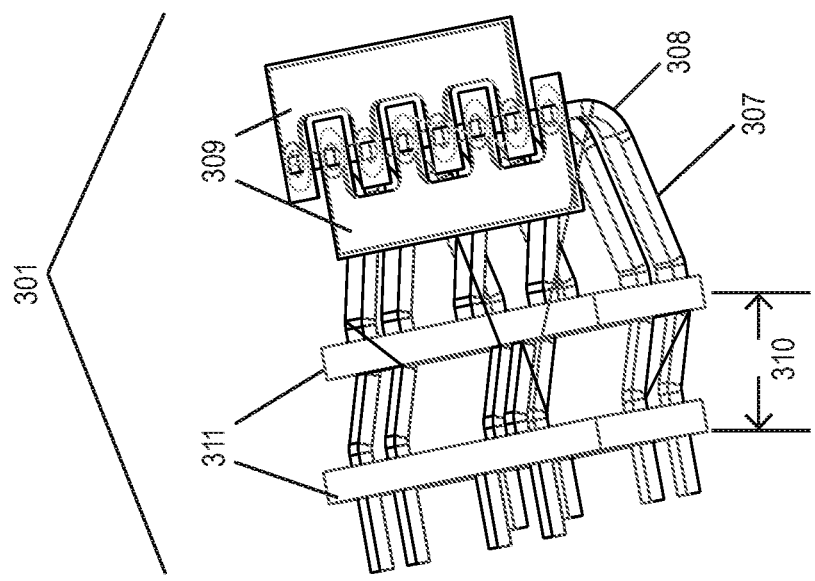
FIG. 14 is an inverted isometric view of the jack contact set of FIG. 11.
Figure 16:
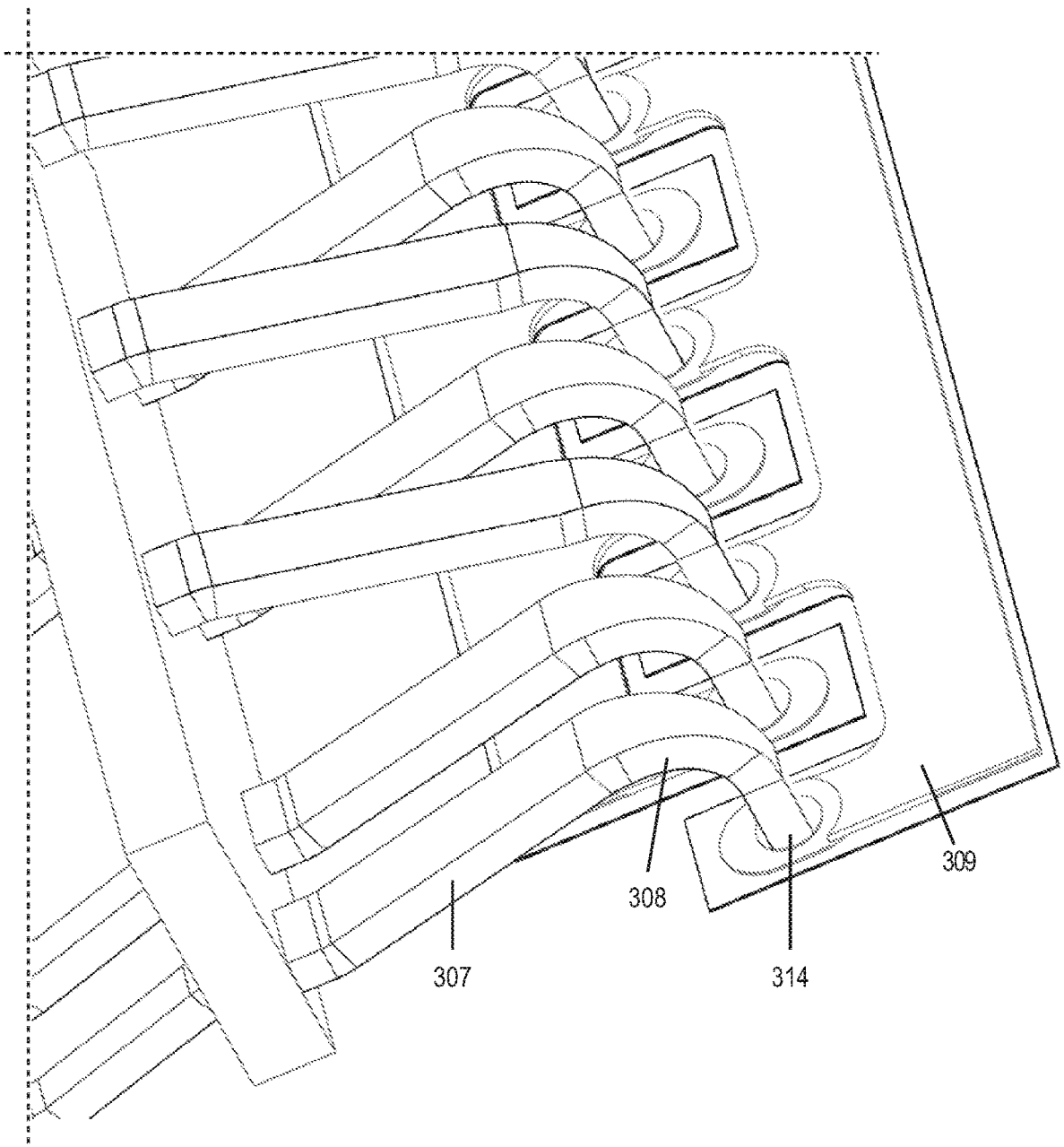
FIG. 16 is a detail view of the jack contact set of FIG. 11.
Figure 17:
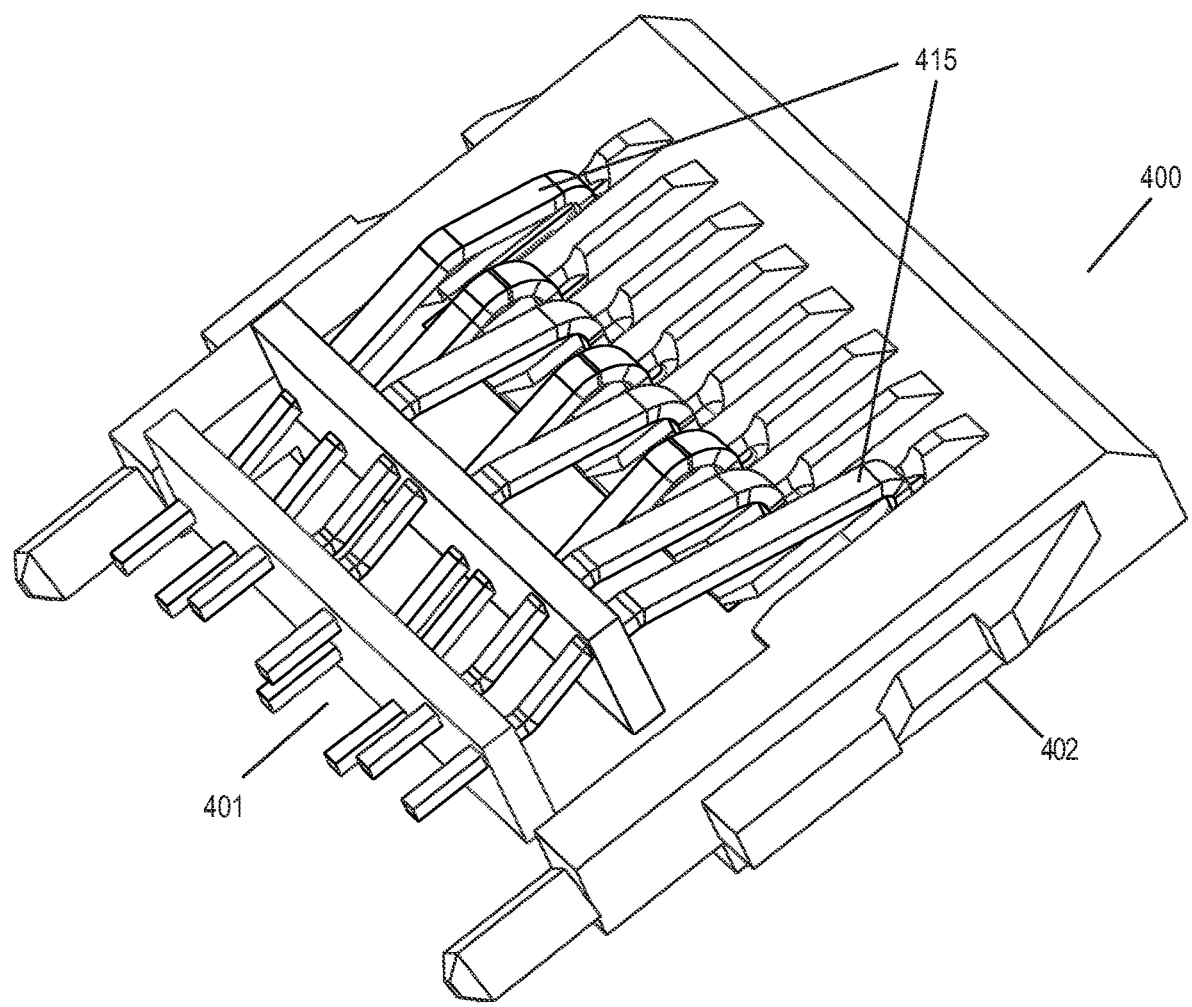
FIG. 17 is an isometric view of a jack contact set and guide frame according to a third embodiment of the connector as disclosed herein.
Figure 19:
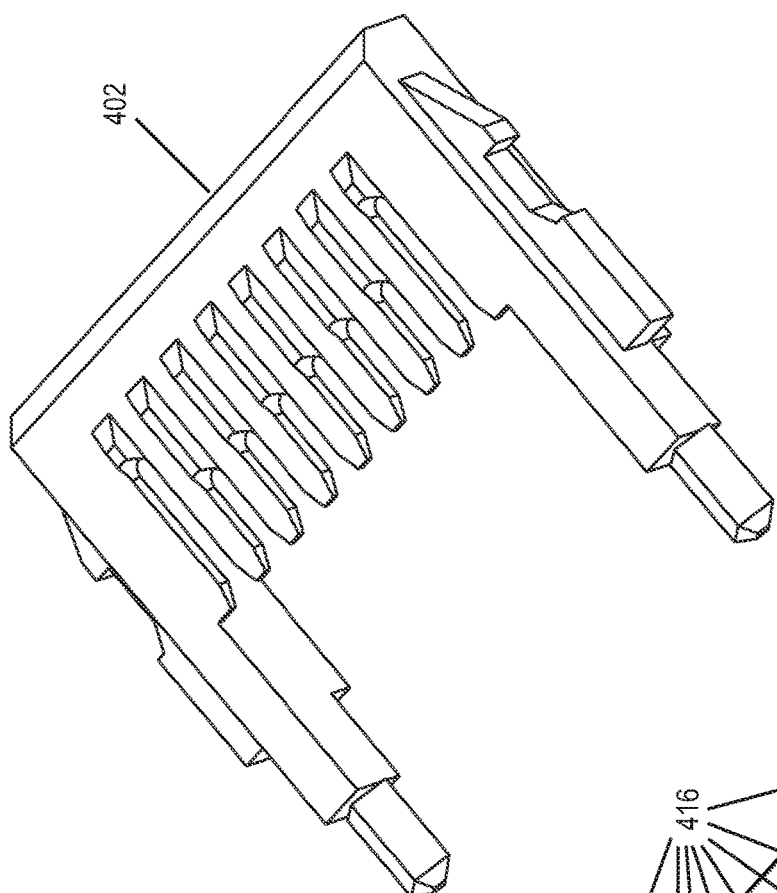
FIG. 19 is an isometric view of the guide frame of FIG. 17.
Figure 18:
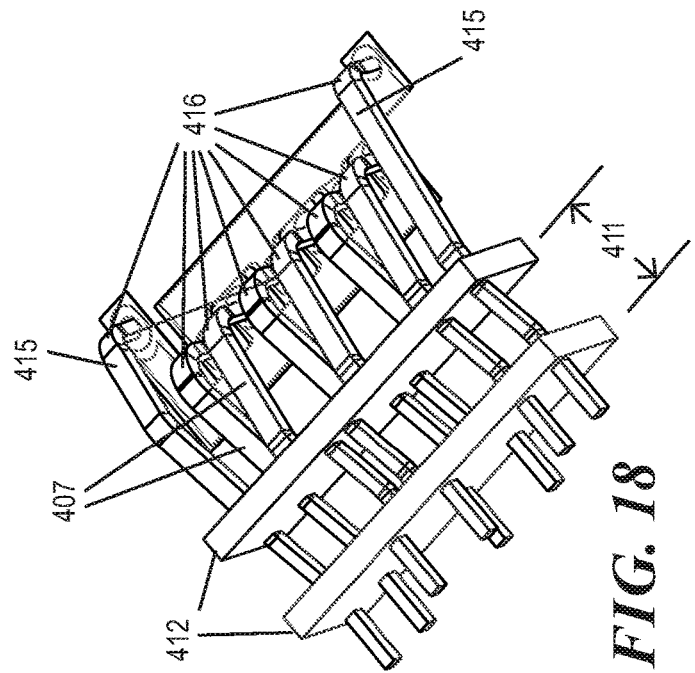
FIG. 18 is an isometric view of the jack contact set of FIG. 17.
Figure 20:
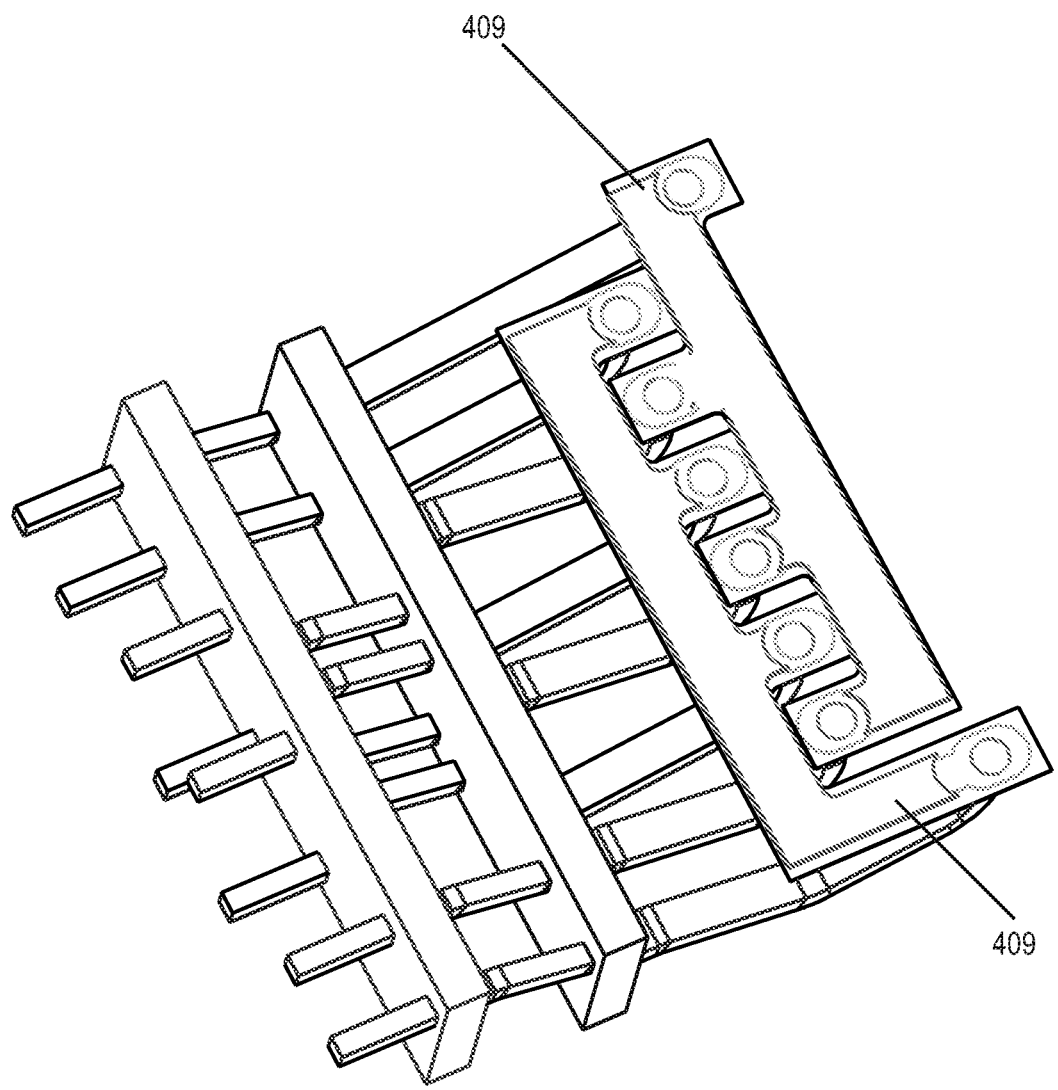
FIG. 20 is an inverted isometric view of the jack contact set of FIG. 17.

The design details of the dual FCBs 209 of the present embodiment are illustrated in FIG. 8. They are comprised of multiple layers of components, further described herein. A flexible substrate 220 may be composed of an insulating polymer with a controlled dielectric constant and thickness. This material provides the base foundation on which the FCB 209 is constructed. Top and bottom copper layers 221, 222 are applied and bonded to this material 220 to control their location and any solder resist 225 is applied over the copper layers 221, 222.

The top and bottom copper layers 221, 222 are conductive layers that are deposited and bonded to opposing sides of the substrate 220 and configured to provide the desired electrical properties. The bonding maintains the location and configuration during use and while being subjected to external bending forces. In the illustrated example, the common capacitor pad (position 6 is common to the even contacts and position 3 is common to the odd contacts) is located on the bottom copper layer 222. The size of the capacitor pad on the bottom copper layer 222 is larger than the size of the pads on the top copper layer 221.

The overlapping portions 223 of the top and bottom copper layers 221, 222 create three capacitance values when separated by a dielectric material (the flexible substrate layer 220). These three areas form what is referred to as parallel plate capacitors. The value of a parallel plate capacitor is a function of the overlapping area 223, the distance between the copper plates, and the dielectric constant of the material that separates these plates. In this FCB 209 the area of the capacitor plates that are located on the top copper layer 221 are smaller than the plate area on the bottom copper layer 222. Since the capacitance is controlled by the area of the overlapping portion of the plates, the smaller plate dictates the capacitance value. The bottom plate is larger than the plate on the top copper layer 221 to allow for registration mismatch between the copper layers. As long as the smaller plate is within the envelope of the larger plate the effective area of the capacitor plates is maintained and thus the capacitance value will be constant.

Surrounding the through holes in the FCBs 209 are copper solder pads 226. These pads 226 provide surfaces for the solder to adhere to when the contacts are soldered to the FCBs 209. The pads 226 are on both top and bottom copper sides to assure that good connections are made. Having solder pads 226 on both sides provides both electrical and mechanical connection to the FCB 209.

As its name implies, the solder resist 225 prevents the solder from adhering to unintended surfaces. The solder resist 225 may be composed of non-conducting material laminates that cover portions of the copper layers 221, 222 and the substrate 220. These solder resist materials are selectively applied in the areas where exposed copper could also contact extraneous conductive materials and potentially cause short-circuits. In the areas where solder connections are desired (solder pads for instance) no solder resist material would be applied. The solder resist also prevents high voltage arcs from forming and jumping the gaps between copper surfaces of different electrical potential.

Outboard of the contact interface points 215, the contact branches 208 and their associated FCBs 209 are the lead-in portion 210 of the jack contacts 207. These lead-in portions 210 engage with the plug as it is inserted and prior to full insertion. These lead-in portions 210 guide the jack contacts 207 onto the plug contacts and prevent binding, buckling or mis-mating. The lead-ins 210 are narrow to reduce contact-to-contact electrical coupling, keeping the contacts as short as possible. Just as with the branches 208, these lead-ins may be integral parts of the jack contacts 207, thus eliminating the need for any additional components.

The tails (signal output portions) 213 of the jack contacts 207 are separated into two planes in the cross-over area 211. Also in this area, the contacts 207 are jogged together and apart to control the coupling between pairs. Maintaining the location of the jack contacts 207 are two molded plastic insulating alignment members or carriers 212. These carriers 212 hold the contacts in the cross-over area 211 in proper alignment and keep the electrical coupling in this area stable. Without these carriers 212, the contacts 207 could deflect at different rates as the plug is inserted during mating. The contact carriers 212 keep the contacts moving together and moving in parallel. If not restrained, the varying rates of deflections could move the cross-overs relative to each other causing varying changes in coupling between the pairs. This variation would make compensation very difficult. By linking them with a solid insulating material, they support each other mechanically while still being electrically independent. Mechanically, the contacts can deflect as a unit, maintaining higher contact force than a single contact alone. This way, they are also protected from excessive stress to a single contact since they are all tied together and can share the stress. As illustrated, each jack contact 207 includes a plug contact portion 215 extending a first direction from a first carrier, and a signal output portion 213 extending in the opposite direction from a second carrier, with the signal output portions 213 collectively arranged for connection to a rigid PCB 103 providing secondary compensation.

Surrounding the contact set 201 is an insulating frame 202. Slots in this frame locate the tips of the contact lead-ins 210. These slots protect the contacts from foreign objects or misaligned plugs that may be forced into the jack. Small ribs on the frame engage with the plug interface and guide the plug into proper alignment.

A second embodiment of the jack interface connector 300 is now described with reference to FIGS. 11-16. The second embodiment incorporates many features that are depicted in the first embodiment, primarily differing with respect to the contact assembly 301 and the contact guide frame 302. Notably, the compensation FCBs 309 are attached to interconnection lead-in tips 308 of the contacts, not to side branches.

In one example, the jack contacts 307 are extended with short curved portions 308 to provide mounting of the FCBs 309 at the ends 314 thereof. The FCBs 309 are electrically and mechanically mounted via soldering, welding, or otherwise bonding. The contact portions 308 connect primary compensation to the jack contact interface point. These branches 308 should straddle the plastic barrier walls that are part of the plug specification. The bend transition between the contact 307 and the lead-in portion 308 may preferably be gradual to best promote the mating of the plug contact without binding, buckling or mis-mating that can be caused by an abrupt surface change. These lead-in tips 308 may be integral parts with respect to the jack contacts 307, thus eliminating the need for additional components to serve this purpose. The tips 308 may for example be stamped and formed from the same piece of native base material. Because the length and transition of the lead-in portion 308 is between the contact interface and the primary compensation, the electrical length should be kept short to reduce phase mismatch and/or excessive compensation capacitance.

As with the first embodiment, the contact set 301 according to the second embodiment is surrounded by an insulating frame 302. Slots in this frame 302 similarly locate the tips of the contact lead-ins 308, and protect the contacts 301 from foreign objects or misaligned plugs that may be forced into the jack. The slots 302 may preferably however be tighter than those described with respect to the first embodiment to better control and protect the shorter contact lead-in tips.

A third embodiment of the jack interface connector 400 is now described with reference to FIGS. 17-20. The third embodiment is similar in most respects to the second embodiment, primarily differing with respect to the contact assembly 401 and the contact guide frame 402 in that the outer contacts 415 (e.g., in positions 1 and 8) are longer than the inner contacts 407 (e.g., in positions 2-7). This extra length allows these two outer contacts 415 to engage the mating plug earlier and act to guide the inter-mating of the plug and jack contacts. As the plug engages the outer contacts 415, it is guided into position and the engagement of the shorter inner contacts 407. The electrical performance of positions 1 and 8 are less sensitive to changes in electrical length than the inner positions so these longer outer contacts have no derogatory effect on the electrical performance on the connector system as a whole.

As with the second embodiment, contact interconnection lead-in tips 416 are provided at the end of the outer contacts 415 and the inner contacts 407. To accommodate the longer guide contacts 415 on positions 1 and 8, the FCBs 409 are modified accordingly. As with the electrical length of the contacts, the additional trace length of positions 1 and 8 does not significantly affect the overall electrical performance of the connector system. The contact guide frame 402 is also modified from the second embodiment, wherein the slot length of the guide frame 402 varies to accommodate the differences in the contact lengths.

Figure 21:
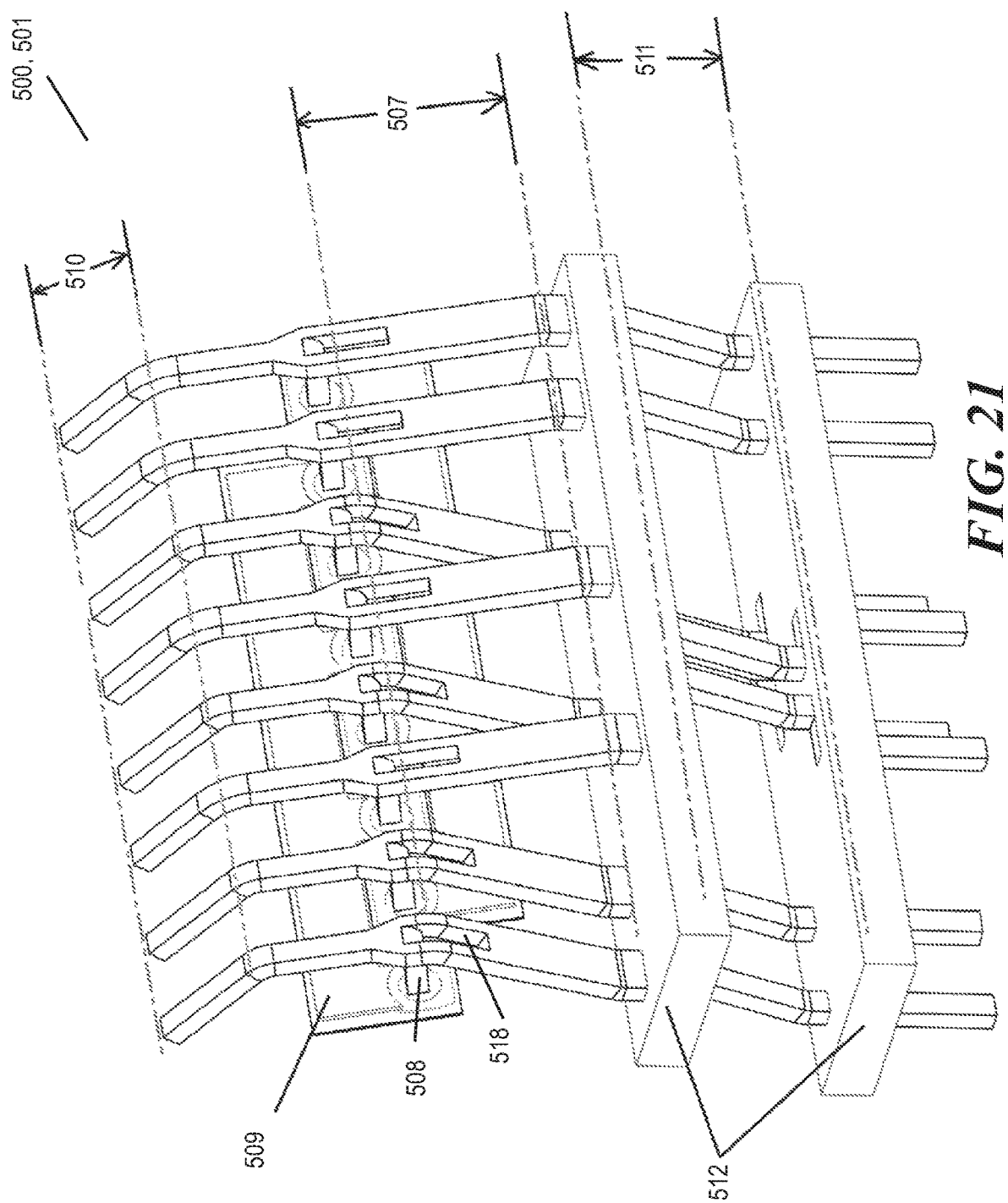
FIG. 21 is an isometric view of a jack contact set according to a fourth embodiment of the connector as disclosed herein.
Figure 22:
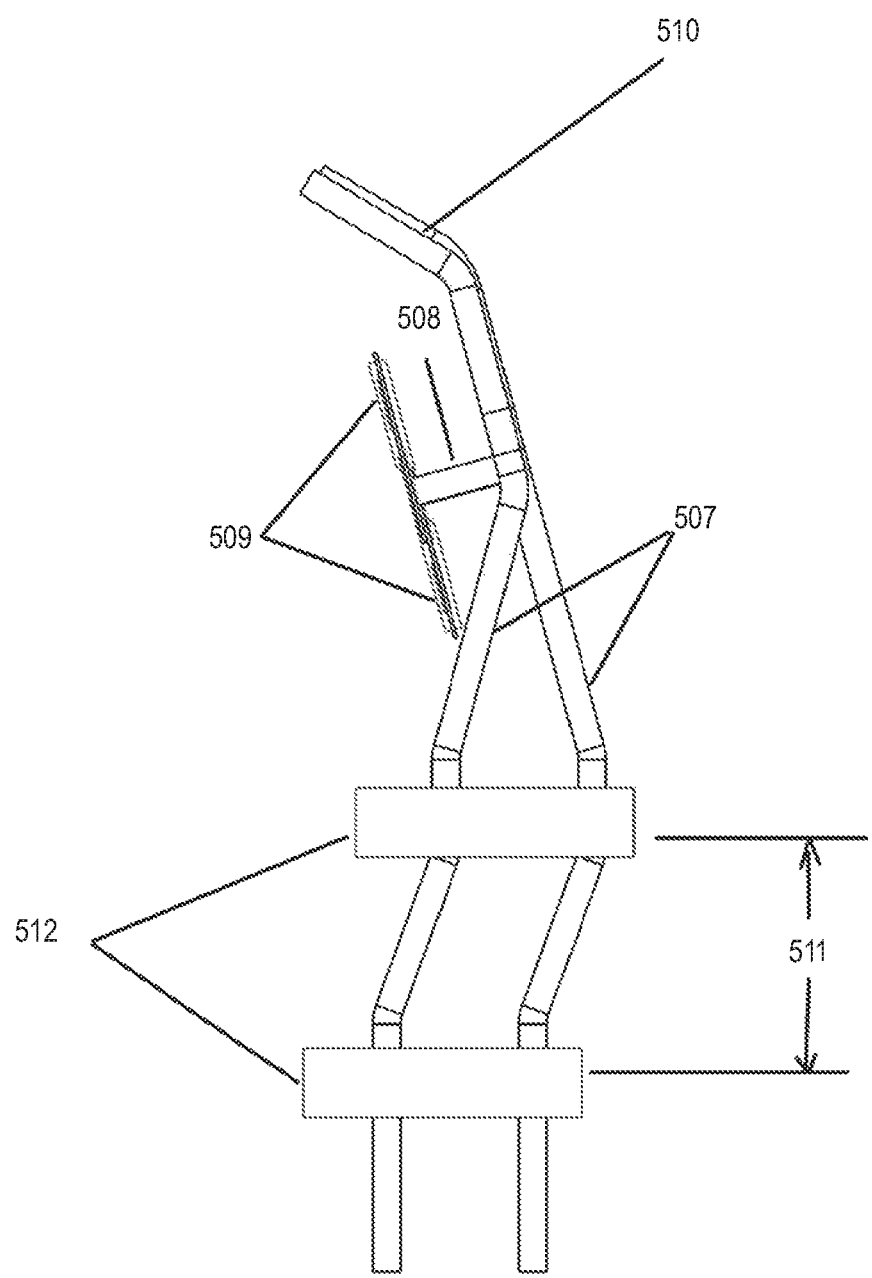
FIG. 22 is a side view of the jack contact set of FIG. 21.

A fourth embodiment of the jack interface connector 500 is now described with reference to FIGS. 21-22. The fourth embodiment is similar in most respects to the first embodiment, primarily differing with respect to the interconnection branches 508 of the contact assembly 501. More particularly, these branches 508 are not only integral parts of the jack contacts 507, thus eliminating the need for additional components to serve this purpose, but they are sheared out of a central portion 518 of the short jack contacts 507 and formed from the same piece of native base material.

Figure 23:
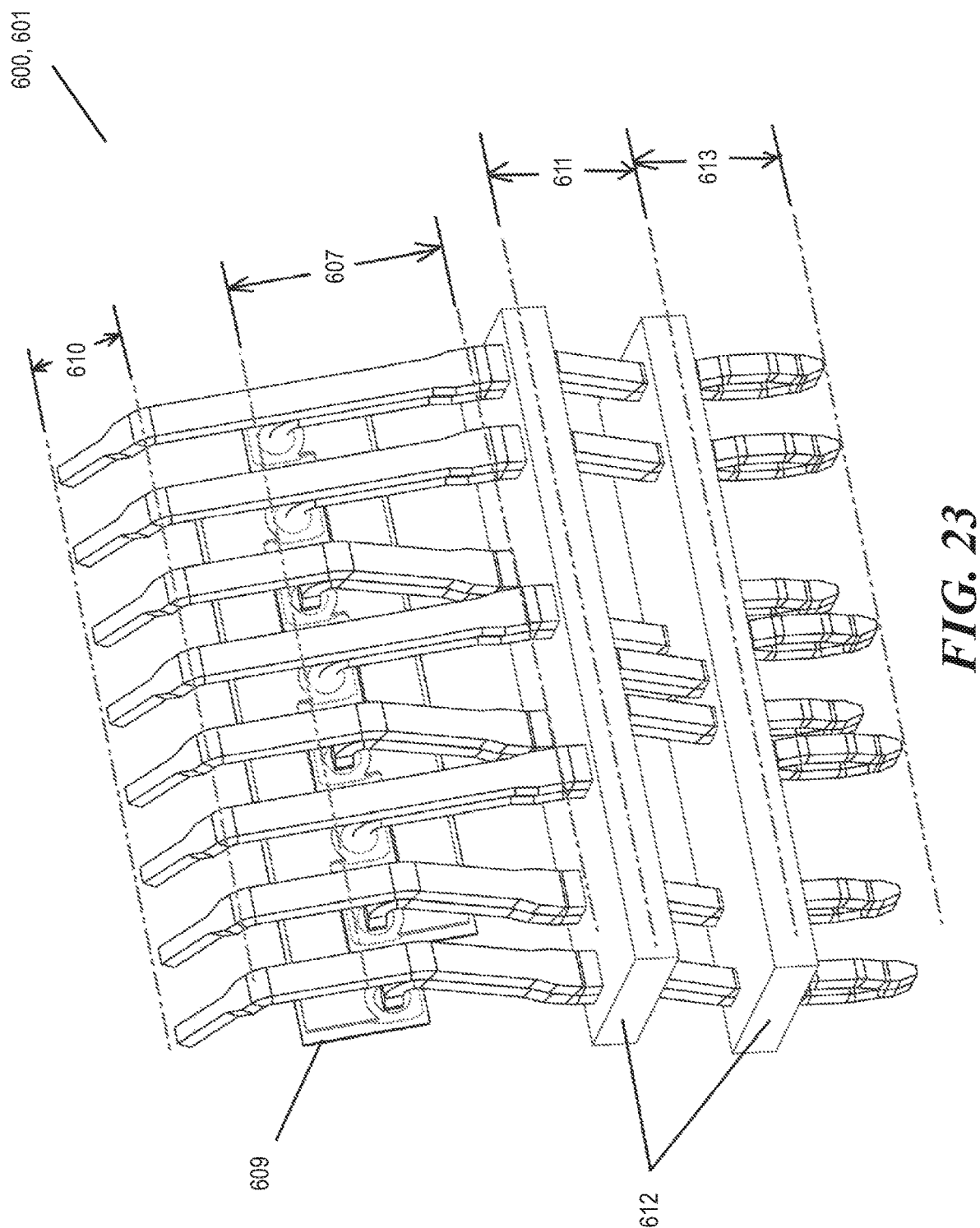
FIG. 23 is an isometric view of a jack contact set according to a fifth embodiment of the connector as disclosed herein.
Figure 24:
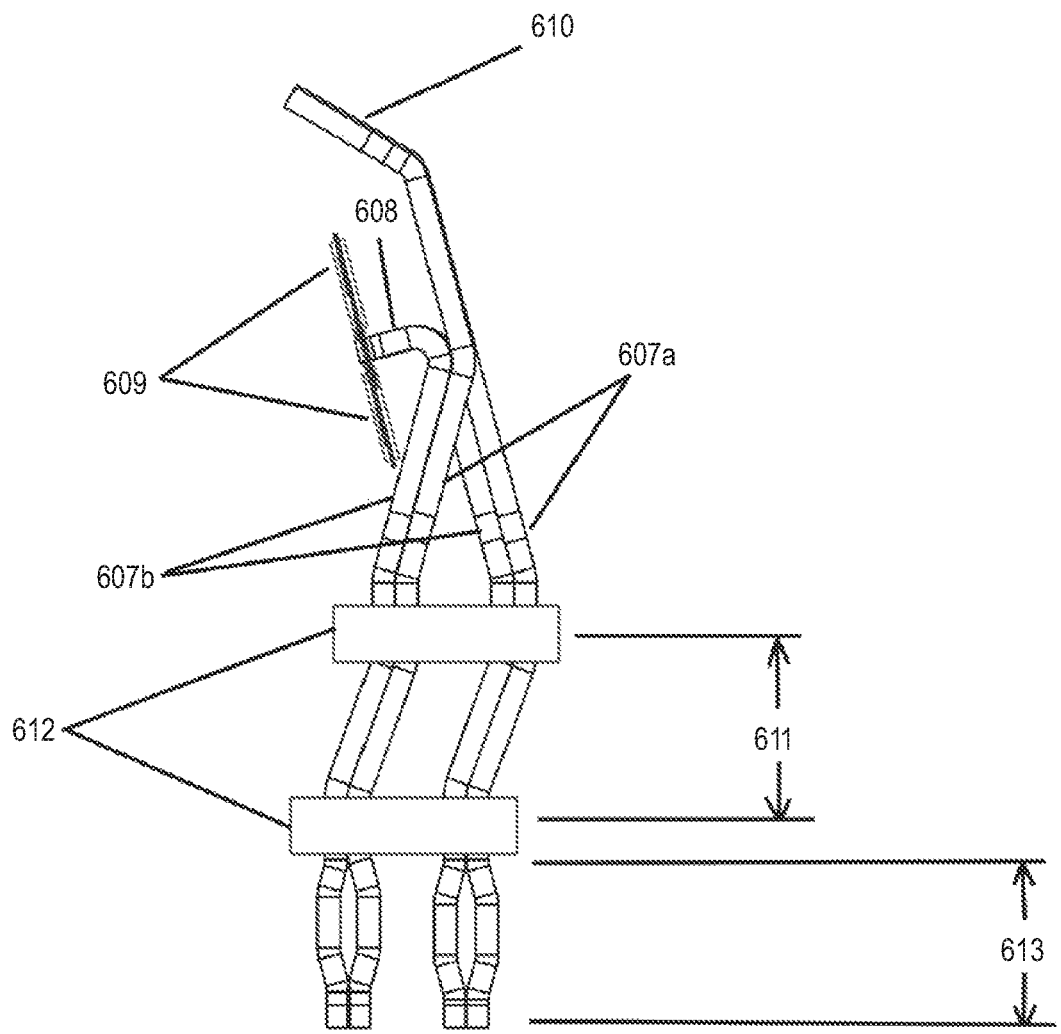
FIG. 24 is a side view of the jack contact set of FIG. 23.

A fifth embodiment of the jack interface connector 600 is now described with reference to FIGS. 23-24. The fifth embodiment is similar in most respects to the first embodiment, primarily differing with respect to the contact assembly 601. More particularly, the contact assembly 601 includes not only the series of contacts 607a arranged to interface with the plug contacts, but also a second and parallel series of contacts 607b. Since the primary contacts 607a are preferably short, thin and flexible as described above, the set of secondary contacts 607b is added to provide additional contact force and reliability. This may eliminate the need for a helper spring as previously described, and further eliminates the need for the interconnection branches described in the first embodiment. By removing the branches, the manufacturing complexity of the primary contacts may be reduced.

At the tip of the secondary jack contacts 607b are short curved portions 608 that are extended to provide mounting of the FCBs 609. The FCBs 609 are electrically and mechanically mounted via soldering, welding, or otherwise bonding. The tips of the secondary contacts 607b are in physical contact with the primary contacts 607a and make short electrical connection between the primary compensation and the jack contact interface point. These tips should straddle the plastic barrier walls that are part of the plug specification. The bend transition of the secondary contacts 607b no longer needs to be gradual since it does not make direct physical contact with the plug. The primary contact 607a offers a smooth and straight interface that will not bind, buckle or mis-mate that can otherwise be caused by an abrupt surface change.

The portions 613 of the contacts that are inserted into the secondary compensation PCB 103 (as previously described) are specially formed. The primary 607a and secondary contacts 607b are jogged in opposite directions so that they form a resilient interconnection pin. The distance between the jogged portions is greater than the size of the receiving hole in the rigid PCB 103. These pins are forced into the smaller holes when the jack is assembled. The radial force of the sides of the hole provides substantial reaction force on the primary 607a and secondary 607b contacts. This force maintains a stable interconnection and eliminates the need for a soldered joint, thus eliminating associated manufacturing operations and reducing cost.

Figure 25:
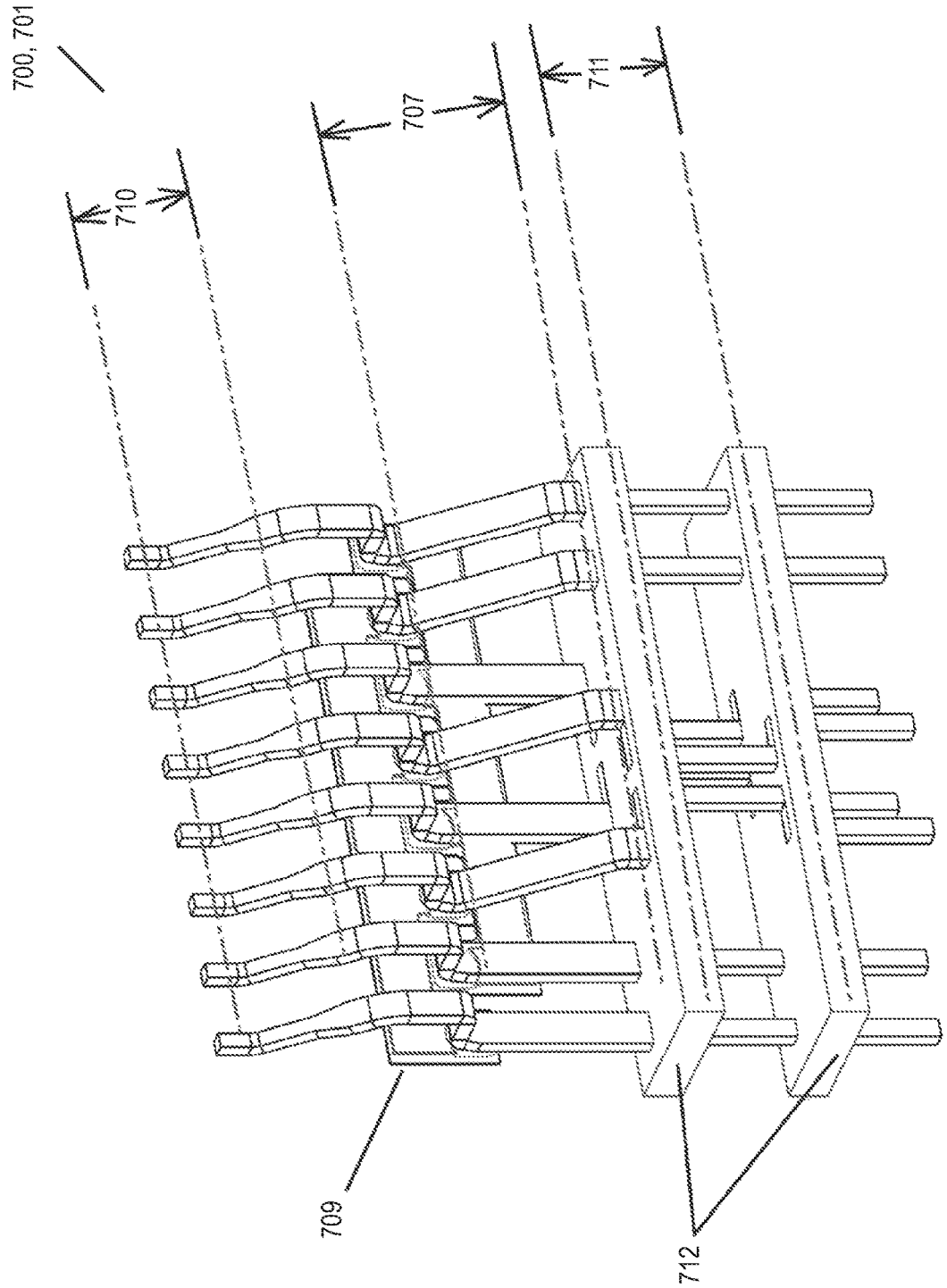
FIG. 25 is an isometric view of a jack contact set according to a sixth embodiment of the connector as disclosed herein.
Figure 26:
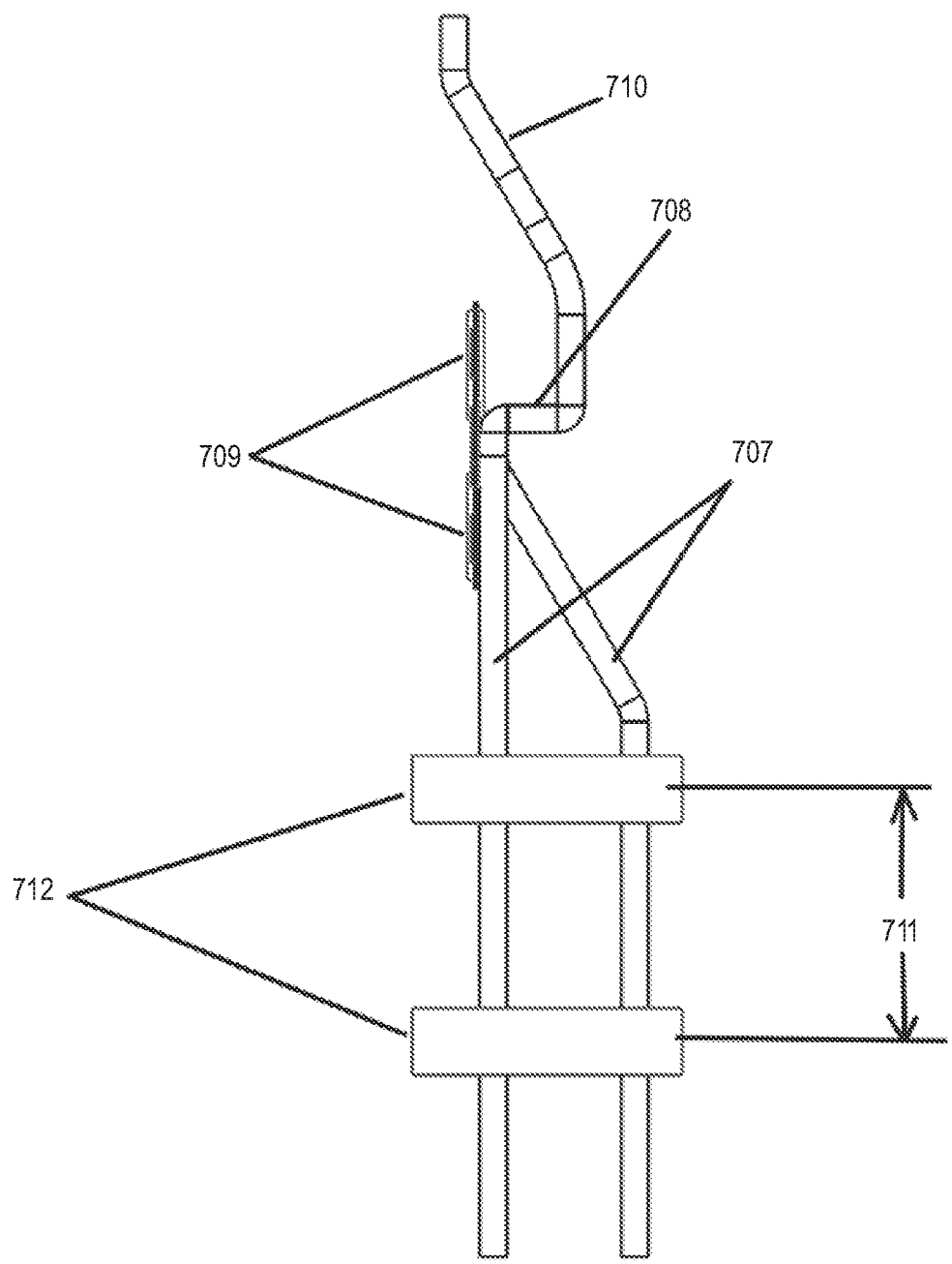
FIG. 26 is a side view of the jack contact set of FIG. 25.

A sixth embodiment of the jack interface connector 700 is now described with reference to FIGS. 25-26. The sixth embodiment is similar in most respects to the first embodiment, primarily differing with respect to the interconnecting branches being eliminated in their previous form and incorporated in the transition 708 between the lead-in 710 and the short jack contacts 707.

The portion of the stamped contact array between the jack contact interface and the primary compensation FCBs 709 should be as short as possible, and may be referred to herein as the short jack contact/contact lead-in transition area 708. This transition area 708 is accomplished by a short right angle jog in the native contact 707. They are integral parts of the jack contacts 707, thus eliminating the need for additional components to serve this purpose. This jog should also straddle the plastic barrier walls that are part of the plug specification, yet provide a short direct electrical pathway. On one side of the jog is a flat surface to which the FCBs 709 are mounted via soldering, welding, or otherwise bonding, as may be performed by a "surface mounting" process as known in the art.

Figure 27:
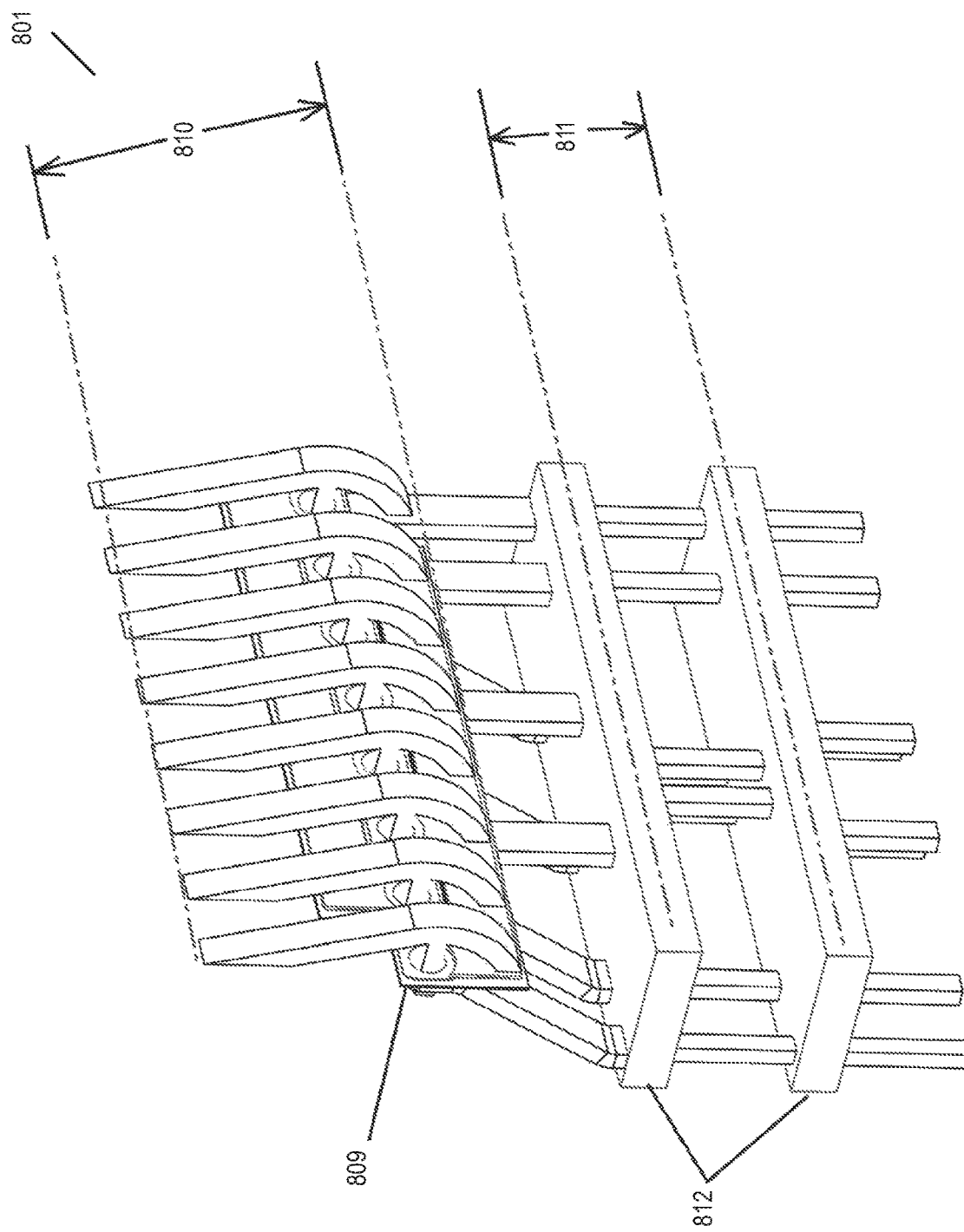
FIG. 27 is an isometric view of a jack contact set according to a seventh embodiment of the connector as disclosed herein.
Figure 28:
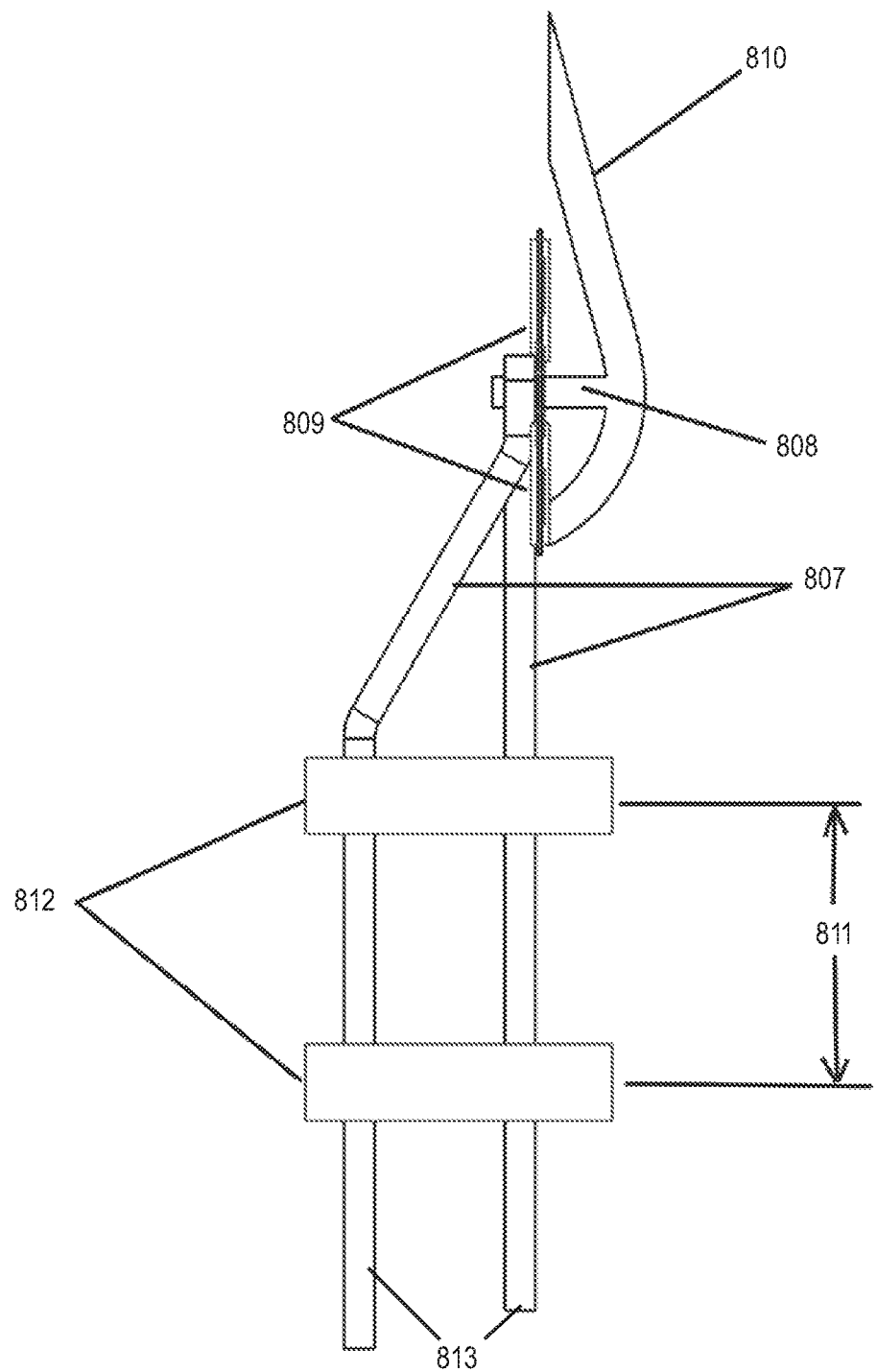
FIG. 28 is a side view of the jack contact set of FIG. 27.

A seventh embodiment of the jack interface connector 800 is now described with reference to FIGS. 27-28. The seventh embodiment is similar in most respects to the first embodiment, primarily differing in that there are separate contact tips 810 that perform the function of the interconnecting branches and the lead-in area.

The contact tips 810 are separate short curved structures applied to the ends of the short jack contacts 807, and guide the plug, by way of the plug's plastic barrier walls, into position during the mating operation. The bend transition between the contact point and the lead-in portion may preferably be gradual to best promote the mating of the plug contact without binding, buckling or mis-mating that can be caused by an abrupt surface change. Each lead-in tip 810 contains a short interconnection branch 808 as an integral part, thus eliminating the need for additional components to serve this purpose. The tips 810 are cut away to ensure that the capacitive coupling between neighboring tips remain at the lowest possible value.

Each of the eight short interconnection branches 808 of the corresponding contact interconnection lead-in tips 810 pass through a finger of the FCBs 809 and thus interconnects all eight of the tips 810, the two FCBs 809 and the eight short jack contacts 807 with a minimum of bonding joints. These branches 808 connect primary compensation to the jack contact interface point with the shortest possible electrical length. These branches 808 may preferably straddle the plastic barrier walls that are part of the plug specification, and comprise integral parts of the jack contacts 807, thus eliminating the need for additional components to serve this purpose. For example, the branches 808 may be sheared out of the central portion of the contact interconnection lead-in tips 810 and formed from the same piece of native base material.

Figure 29:
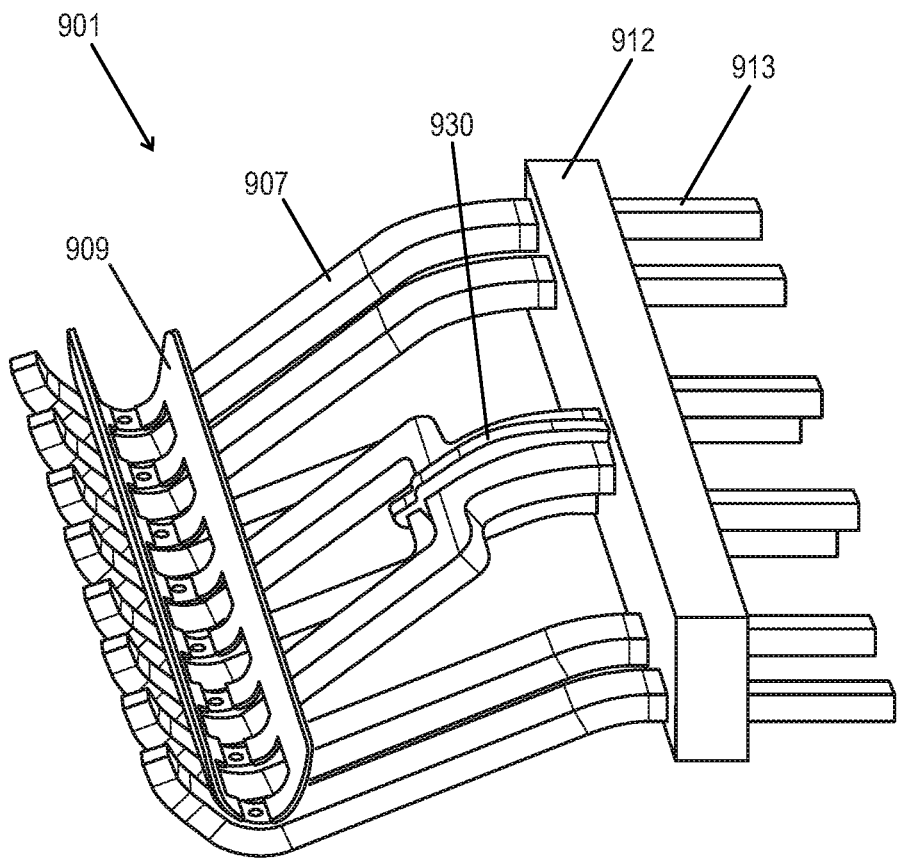
FIG. 29 is an isometric view of a jack contact set according to an eighth embodiment of the connector as disclosed herein.
Figure 30:
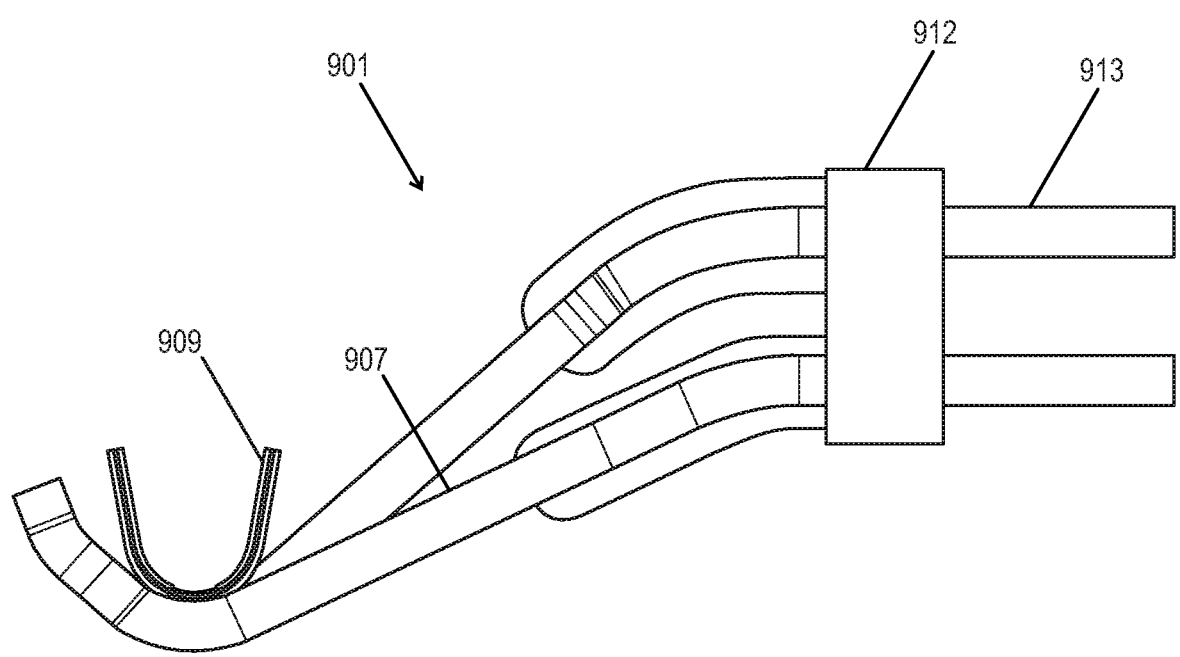
FIG. 30 is a side view of the jack contact set of FIG. 29.
Figure 31:
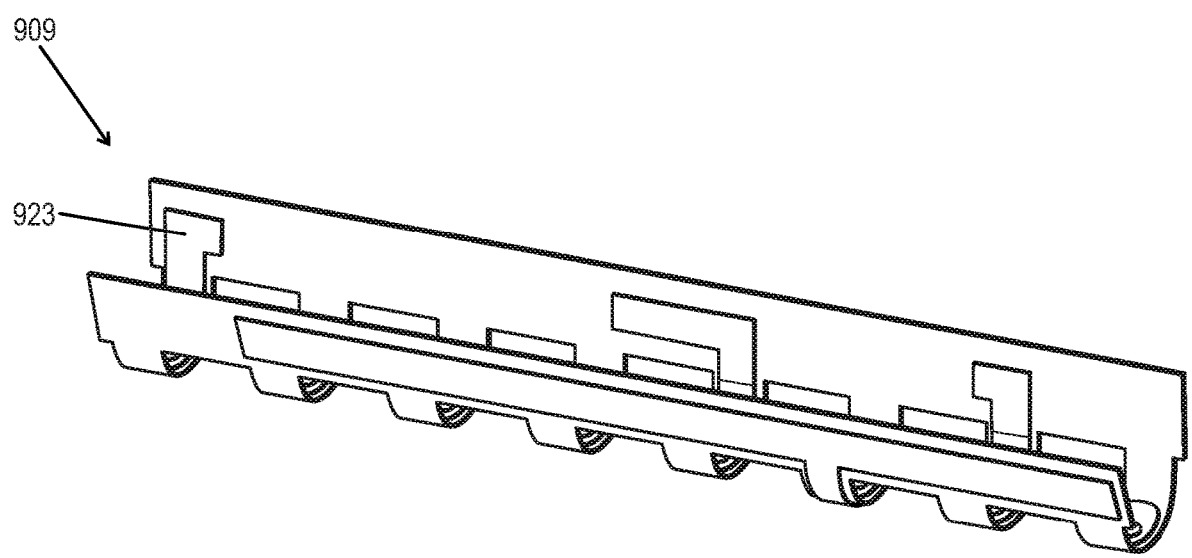
FIG. 31 is a detail view of the flexible circuit board of the jack contact set of FIG. 29.

An eighth embodiment of the jack interface connector 900 is now described with reference to FIGS. 29-31. This eighth embodiment differs from the previous embodiments in that a single FCB 909 is electrically and physically coupled at a middle portion to an inner portion of each of the contacts 907 in the contact assembly 901. Parallel capacitor plates 923 are provided in the single FCB 909, having overlapping areas in opposing ends with respect to the middle portion. The FCB 909 further differs from previous embodiments in that it may be flexed from the middle portion on both opposing ends into an arcuate configuration.

As with other embodiments as previously described, the primary compensating capacitance of the FCB 909 is in immediate proximity with the plug interface but maintained outside of the signal path, defined by a plug interface (outer) portion of the contact 907 and an interface portion 913 with the secondary compensation PCB 103. In other words, signals provided from the plug are transmitted through the jack contacts 907 to the rigid PCB 103 via ends 913, but without traveling through the FCB 909 as being connected proximate to the plug interface but specifically offset set from the signal path. One desirable aspect of the offset may include that it introduces a controlled amount of inductance to the phase of the compensation circuit, approximately equal to the inductance of the corresponding plug contact blades. That compensating inductance allows the plug connector as disclosed herein to provide Near End Cross Talk compensation across very wide spectra from 10 to 2000 MHz. Exemplary offset dimensions in such an embodiment may range from 0.001" to 0.030".

Figure 32:
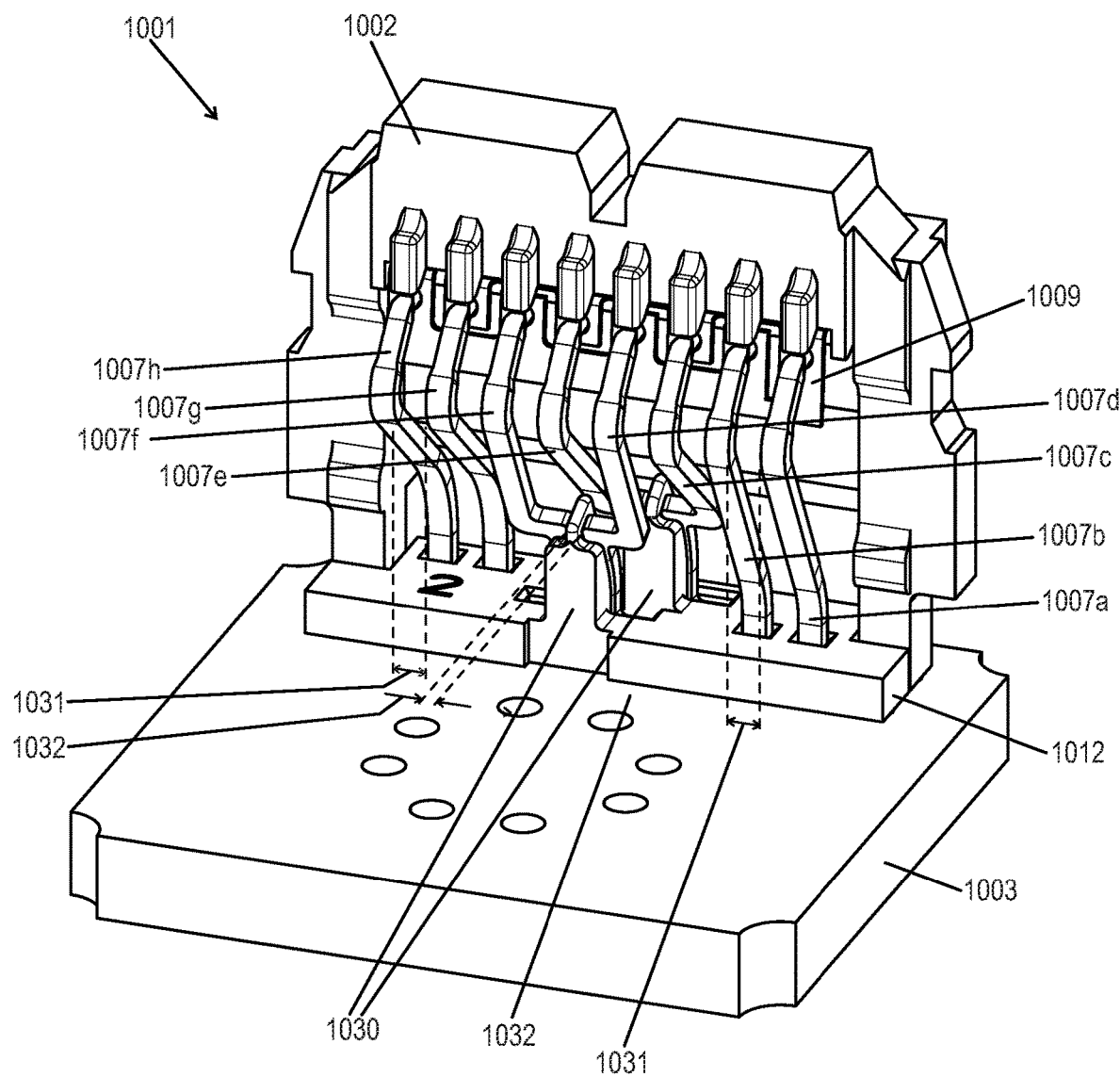
FIG. 32 is a first view of a jack contact set according to a ninth embodiment of the connector as disclosed herein.
Figure 33:
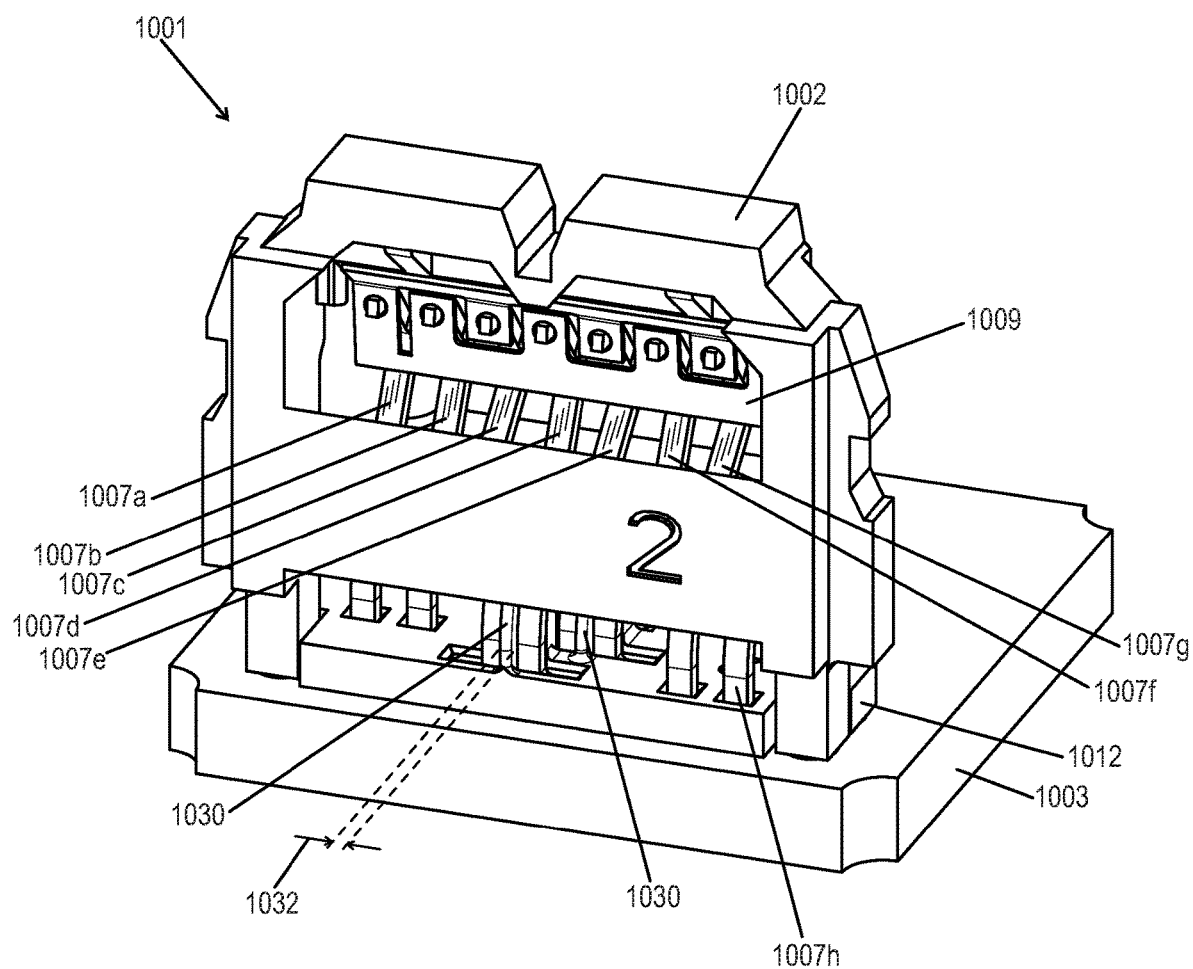
FIG. 33 is a second view of the jack contact set of FIG. 32.
Figure 34:
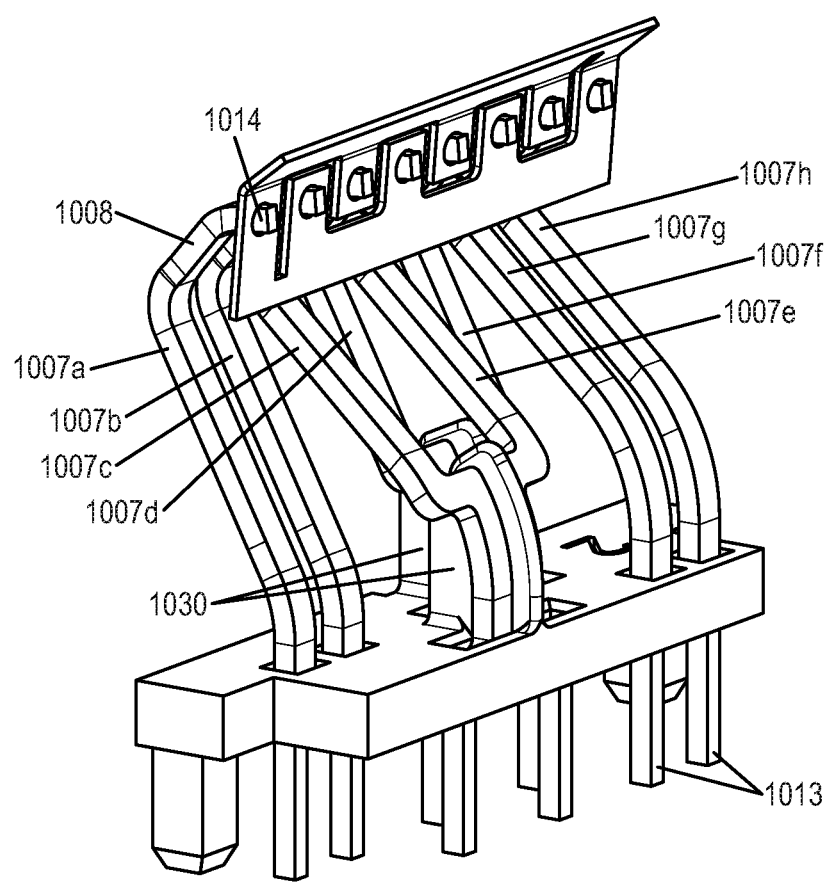
FIG. 34 is a third view of the jack contact set of FIG. 32.

A ninth embodiment of the jack interface connector 1000 is now described with reference to FIGS. 32-34. A single FCB 1009 is electrically and physically coupled at the respective tips 1009 of each of the contacts 1007 in the contact assembly 1001. The FCB in an example as illustrated in FIG. 34 includes an interior aperture having a serpentine configuration so as to provide gaps in the FCB substrate between each adjacent contact tip, and may further be flexed along at least one middle portion into a semi-arcuate form. The semi-arcuate form may facilitate engagement of the contacts and the FCB with the insulating frame 1002 of the assembly.

As with other embodiments as previously described, the primary compensating capacitance of the FCB 1009 is in immediate proximity with the plug interface but maintained outside of the signal path, defined by a plug interface (outer) portion of the contact 1007 and an interface portion 1013 with the secondary compensation PCB 1003. In other words, signals provided from the plug are transmitted through the jack contacts 1007 to the rigid PCB 1003 via ends 1013, but without traveling through the FCB 1009 as being connected proximate to the plug interface but specifically offset set from the signal path.

Various embodiments of a jack connector as disclosed herein may further be distinguishable on the basis of a reduced air gap between certain adjacent contacts, and one or more transverse insulators disposed there between.

One of skill in the art may appreciate the need for adjacent contacts not to short circuit when 1000 volts DC is applied across them. In various conventional contact assemblies, contacts are spaced on 0.040" centers and they are 0.018" wide, which results in a 0.022" air gap between them. As the typical dielectric strength of air is 70 volts per 0.001", the air gap of 0.022" would not result in a short circuit until the voltage reaches 1540 DC volts. However, for improved performance it is desirable to reduce the air gaps between at least certain pairs of adjacent contacts as much as possible.

Referring for example to at least the ninth embodiment of the connector 1000 as disclosed herein, at least one pair of adjacent contacts are not separated along their respective lengths in an equidistant manner between the FCB 1009 and the secondary compensation PCB 1003, but rather are jogged inward and towards each other. In the example illustrated in FIG. 34, contacts 1007*a*, 1007*b*, 1007*g*, and 1007*h* each extend between the FCB and the secondary compensation PCB along parallel vertical planes (e.g., transversely disposed with respect to a "horizontal" plane of the PCB). Contacts 1007*c* and 1007*e* extend from the FCB in parallel planes, and then jog inwards toward each other before again turning and extending to the PCB along substantially parallel planes. Contacts 1007*d* and 1007*f* likewise extend from the FCB in parallel planes with respect to each other, and then jog inwards before again turning and extending to the PCB along substantially parallel planes with respect to each other.

The inwardly extending configuration for at least a portion of the adjacent contacts results in an air gap of, e.g., 0.009" (about 0.23 mm) there between, which would short circuit with the application of only 630 volts DC. To prevent dielectric voltage breakdown but still enable the air gap to be minimized as much as possible, a transverse insulator 1030 is added in the form of a rib of plastic material between the aforementioned contacts at the inwardly extended portions.

The term "transverse insulator" refers to an insulating barrier that may be positioned in the narrow gap between the adjacent contacts, and further extends along the air gap in a substantially transverse orientation with respect to the aforementioned plane of the PCB. However, the transverse insulator may have portions of a non-transverse orientation within the scope of the present disclosure, such as for example in embodiments where the intended barrier may be integrally formed with respect to an insulating alignment member 1012 along the face of the PCB.

The rib in an embodiment may be 0.008" wide with a 0.0005" clearance at either side between the rib and the respective adjacent contacts.

The rib may in an embodiment be manufactured of liquid crystal polymer (LCP) plastic material having a dielectric strength of 812 volts per 0.001", wherein almost 6500 volts DC would be required to short circuit across the 0.008" wide rib of plastic.

The transverse insulator 1030 is not limited to application in association with the ninth embodiment of the connector 1000 as disclosed herein, but may further be applied for various other embodiments as disclosed herein, or foreseeable equivalents and modifications thereto. See for example the transverse insulator 930 as provided for the embodiment of FIGS. 29-31, as well as first through seventh embodiments having inwardly jogged portions of at least first pairs of contacts in at least respective contact cross-over areas, wherein an appropriately configured transverse insulator may be provided for air gaps of less than 0.01" to prevent dielectric voltage breakdown.

Throughout the specification and claims, the following terms take at least the meanings explicitly associated herein, unless the context dictates otherwise. The meanings identified below do not necessarily limit the terms, but merely provide illustrative examples for the terms.

The meaning of "a," "an," and "the" may include plural references, and the meaning of "in" may include "in" and "on." The phrase "in one embodiment," as used herein does not necessarily refer to the same embodiment, although it may. The term "coupled" means at least either a direct electrical connection between the connected items or an indirect connection through one or more passive or active intermediary devices. Conditional language used herein, such as, among others, "can," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The previous detailed description has been provided for the purposes of illustration and description. Thus, although there have been described particular embodiments of a new and useful invention, it is not intended that such references be construed as limitations upon the scope of this invention except as set forth in the following claims.

What is claimed is:

1. A network interface connector, comprising:
    a jack housing;
    a rigid printed circuit board (PCB);
    a jack contact assembly positioned within the jack housing and further comprising a plurality of elongate contacts each having a plug contact engagement portion and a PCB mounting portion,
    wherein each of the elongate contacts are configured such that a signal path is defined between their respective plug contact engagement portion and PCB mounting portion, and each of the plug contact engagement portions for the plurality of elongate contacts are substantially coplanar with respect to each other and define substantially equidistant first gaps,
    at least a first pair of the plurality of elongate contacts extending towards each other along at least part of their respective lengths wherein at least the respective PCB mounting portions of the at least first pair of elongate contacts define a corresponding second gap smaller than the first gap, wherein the second gap between the at least respective PCB mounting portions of the at least first pair of elongate contacts is less than 0.01 inches; and
    a transverse insulator positioned within the second gap between the at least first pair of elongate contacts and having a dielectric strength configured to prevent dielectric voltage breakdown with an application of 1000 volts DC across the at least first pair of elongate contacts.

2. The network interface connector of claim 1, wherein the transverse insulator comprises a liquid crystal polymer material.

3. The network interface connector of claim 1, comprising first and second transverse insulators positioned in respective first and second air gaps between first and second pairs of elongate contacts.

4. The network interface connector of claim 1, wherein the transverse insulator is integrally positioned in respective first and second air gaps between first and second pairs of elongate contacts.

5. The network interface connector of claim 1, wherein an air gap of approximately 0.0005 inches is provided between the transverse insulator and each of the at least first pair of elongate contacts.

6. The network interface connector of claim 1, further comprising a flexible circuit board (FCB) coupled to each of the plurality of elongate contacts via respective FCB mounting portions, wherein the FCB comprises a flexible substrate with at least first and second copper layers on opposing sides thereof and configured to provide a controlled capacitance compensation between respective contacts engaged thereby and offset from the defined signal paths.

7. The network interface connector of claim 6, wherein each of the elongate contacts have first and second opposing ends, the first end corresponding to the PCB mounting portion and the second end corresponding to the FCB mounting portion, wherein the plug contact engagement portion further comprises a portion of the contact between the PCB mounting portion and the FCB mounting portion and proximate to the first end.

8. The network interface connector of claim 6, wherein the FCB comprises a single substrate having a serpentine aperture disposed therein and configured to define air gaps in the substrate between adjacent contacts engaged thereby.

9. The network interface connector of claim 6, wherein each of the elongate contacts have first and second opposing ends corresponding to the plug contact engagement portion and the PCB mounting portion, respectively, and the FCB mounting portion further comprises a middle portion of the contact.

10. The network interface connector of claim 9, wherein the flexible substrate for each FCB is flexed into an arcuate configuration about a central axis coupled to the FCB mounting portion of a respective elongate contact, the flexible substrate further comprising first and second copper layers applied on opposing sides of the central axis.

11. The network interface connector of claim 6, wherein:
a value of the controlled capacitance is based on a controlled dielectric constant and thickness of the flexible substrate further in view of an overlapping area of first and second copper plates respectively associated with the first and second copper layers, and
the controlled capacitance in the one or more FCBs effectively cancels resident capacitance between adjacent plug contacts coupled to the jack contact assembly.

12. The network interface connector of claim 11, wherein the first copper plate is smaller than and enveloped with respect to the second copper plate.

13. The network interface connector of claim 1, further comprising at least one contact alignment member receiving each of the elongate contacts there through.

14. The network interface connector of claim 13, wherein the at least one contact alignment member is molded over the elongate contacts and formed of an insulating material, wherein the transverse insulator is integrally formed with respect to the insulating material.

15. The network interface connector of claim 13, wherein each of the elongate contacts are coupled to the at least one contact alignment member between their respective plug contact and signal output portions.

16. The network interface connector of claim 13, further comprising an electrically isolated compression spring mounted between an internal wall of the jack housing and the at least one contact alignment member, and configured to apply a normal force to the contact assembly.

17. The network interface connector of claim 1, wherein the PCB mounting portions of a first set of elongate contacts are maintained in a first coplanar array, and the PCB mounting portions of a second set of elongate contacts are maintained in a second coplanar array parallel to the first coplanar array.

18. A network interface connector, comprising:
a jack housing;
a plurality of jack contacts disposed within the jack housing for engaging a plurality of plug contacts and providing a like plurality of signal paths from an interface thereto, wherein each of the plurality of jack contacts have a first end and a second end, the first ends for each of the plurality of jack contacts extending in parallel to the interface and defining substantially equal first gaps there between, and the second ends for at least a first pair of the plurality of jack contacts having a second gap smaller than the first gap there between;
primary compensation means for providing a primary controlled capacitance compensation between respective contacts engaged thereby, in immediate proximity with the interface and offset from the defined signal paths;
secondary compensation means for connecting the plurality of signal paths to active equipment or transmission cables and providing a secondary controlled capacitance compensation thereto; and
insulating means for preventing dielectric voltage breakdown with an application of 1000 volts DC across the second gap between the at least first pair of jack contacts.

19. The network interface connector of claim 18, wherein the second gap between the second ends for at least the first pair of the plurality of jack contacts is less than 0.01 inches.

20. A network interface connector, comprising:
a jack housing;
a rigid printed circuit board (PCB);
a jack contact assembly positioned within the jack housing and further comprising a plurality of elongate contacts each having a plug contact engagement portion and a PCB mounting portion;
wherein each of the elongate contacts are configured such that a signal path is defined between their respective plug contact engagement portion and PCB mounting portion, and each of the plug contact engagement portions for the plurality of elongate contacts are substantially coplanar with respect to each other and define substantially equidistant first gaps;
at least a first pair of the plurality of elongate contacts extending towards each other along at least part of their respective lengths wherein at least the respective PCB mounting portions of the at least first pair of elongate contacts define a corresponding second gap smaller than the first gap;
a transverse insulator positioned within the second gap between the at least first pair of elongate contacts and having a dielectric strength configured to prevent dielectric voltage breakdown with an application of 1000 volts DC across the at least first pair of elongate contacts; and
a flexible circuit board (FCB) coupled to each of the plurality of elongate contacts via respective FCB mounting portions, wherein the FCB comprises a flexible substrate with at least first and second copper layers on opposing sides thereof and configured to provide a controlled capacitance compensation between respective contacts engaged thereby and offset from the defined signal paths,
wherein each of the elongate contacts have first and second opposing ends, the first end corresponding to the PCB mounting portion and the second end corresponding to the FCB mounting portion, wherein the plug contact engagement portion further comprises a portion of the contact between the PCB mounting portion and the FCB mounting portion and proximate to the first end.

21. The network interface connector of claim 20, wherein the transverse insulator comprises a liquid crystal polymer material.

22. The network interface connector of claim 21, wherein the transverse insulator is integrally positioned in respective first and second air gaps between first and second pairs of elongate contacts.

23. The network interface connector of claim 21, comprising first and second transverse insulators positioned in respective first and second air gaps between first and second pairs of elongate contacts.

24. The network interface connector of claim 20, wherein an air gap of approximately 0.0005 inches is provided between the transverse insulator and each of the at least first pair of elongate contacts.

25. A network interface connector, comprising:
a jack housing;
a rigid printed circuit board (PCB);
a jack contact assembly positioned within the jack housing and further comprising a plurality of elongate contacts each having a plug contact engagement portion and a PCB mounting portion;
wherein each of the elongate contacts are configured such that a signal path is defined between their respective plug contact engagement portion and PCB mounting portion, and each of the plug contact engagement portions for the plurality of elongate contacts are substantially coplanar with respect to each other and define substantially equidistant first gaps;
at least a first pair of the plurality of elongate contacts extending towards each other along at least part of their respective lengths wherein at least the respective PCB mounting portions of the at least first pair of elongate contacts define a corresponding second gap smaller than the first gap;
a transverse insulator positioned within the second gap between the at least first pair of elongate contacts and having a dielectric strength configured to prevent dielectric voltage breakdown with an application of 1000 volts DC across the at least first pair of elongate contacts; and
a flexible circuit board (FCB) coupled to each of the plurality of elongate contacts via respective FCB mounting portions, wherein the FCB comprises a flexible substrate with at least first and second copper layers on opposing sides thereof and configured to provide a controlled capacitance compensation between respective contacts engaged thereby and offset from the defined signal paths,
wherein a value of the controlled capacitance is based on a controlled dielectric constant and thickness of the flexible substrate further in view of an overlapping area of first and second copper plates respectively associated with the first and second copper layers, and
wherein the controlled capacitance in the one or more FCBs effectively cancels resident capacitance between adjacent plug contacts coupled to the jack contact assembly.

26. The network interface connector of claim 25, wherein the transverse insulator comprises a liquid crystal polymer material.

27. The network interface connector of claim 26, wherein the transverse insulator is integrally positioned in respective first and second air gaps between first and second pairs of elongate contacts.

28. The network interface connector of claim 26, wherein an air gap of approximately 0.0005 inches is provided between the transverse insulator and each of the at least first pair of elongate contacts.

29. The network interface connector of claim 26, comprising first and second transverse insulators positioned in respective first and second air gaps between first and second pairs of elongate contacts.

* * * * *